(12) United States Patent
Koopman et al.

(10) Patent No.: US 11,847,570 B2
(45) Date of Patent: *Dec. 19, 2023

(54) DEEP LEARNING FOR SEMANTIC SEGMENTATION OF PATTERN

(71) Applicant: ASML NETHERLANDS B.V., Veldhoven (NL)

(72) Inventors: Adrianus Cornelis Matheus Koopman, Hilversum (NL); Scott Anderson Middlebrooks, Duizel (NL); Antoine Gaston Marie Kiers, Veldhoven (NL); Mark John Maslow, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/837,096

(22) Filed: Jun. 10, 2022

(65) Prior Publication Data

US 2022/0327686 A1 Oct. 13, 2022

Related U.S. Application Data

(63) Continuation of application No. 16/968,966, filed as application No. PCT/EP2019/053803 on Feb. 15, 2019, now Pat. No. 11,379,970.

(Continued)

(51) Int. Cl.
*G06N 3/08* (2023.01)
*G06N 3/084* (2023.01)
(Continued)

(52) U.S. Cl.
CPC ............. *G06N 3/084* (2013.01); *G03F 7/705* (2013.01); *G06F 18/214* (2023.01);
(Continued)

(58) Field of Classification Search
None
See application file for complete search history.

(56) References Cited

U.S. PATENT DOCUMENTS 6,961,116 B2 11/2005 Den Boef et al.
7,587,704 B2 9/2009 Ye et al.
(Continued)

FOREIGN PATENT DOCUMENTS

KR 10-2017-0015500 2/2017
TW I584142 5/2017
(Continued)

OTHER PUBLICATIONS

International Search Report issued in corresponding PCT Patent Application No. PCT/EP2019/053803, dated Jun. 3, 2019.
(Continued)

*Primary Examiner* — Leon Flores
(74) *Attorney, Agent, or Firm* — Pillsbury Winthrop Shaw Pittman, LLP

(57) ABSTRACT

A method for training a deep learning model of a patterning process. The method includes obtaining (i) training data comprising an input image of at least a part of a substrate having a plurality of features and a truth image, (ii) a set of classes, each class corresponding to a feature of the plurality of features of the substrate within the input image, and (iii) a deep learning model configured to receive the training data and the set of classes, generating a predicted image, by modeling and/or simulation of the deep learning model using the input image, assigning a class of the set of classes to a feature within the predicted image based on matching of the feature with a corresponding feature within the truth image, and generating, by modeling and/or simulation, a trained deep learning model by iteratively assigning weights using a loss function.

20 Claims, 19 Drawing Sheets

Related U.S. Application Data

(60) Provisional application No. 62/634,540, filed on Feb. 23, 2018.

(51) Int. Cl.

| | | |
|---|---|---|
| *G06T 7/11* | (2017.01) | |
| *G03F 7/00* | (2006.01) | |
| *G06T 7/00* | (2017.01) | |
| *G06F 18/214* | (2023.01) | |
| *G06F 18/2431* | (2023.01) | |
| *G06F 18/2413* | (2023.01) | |
| *G06V 10/764* | (2022.01) | |
| *G06V 10/82* | (2022.01) | |

(52) U.S. Cl.
CPC .... *G06F 18/2431* (2023.01); *G06F 18/24133* (2023.01); *G06N 3/08* (2013.01); *G06T 7/0004* (2013.01); *G06T 7/11* (2017.01); *G06V 10/764* (2022.01); *G06V 10/82* (2022.01); *G06T 2207/30148* (2013.01)

(56) References Cited

U.S. PATENT DOCUMENTS

| | | | |
|---|---|---|---|
| 10,579,772 | B2 | 3/2020 | Fouquet et al. |
| 11,379,970 | B2 * | 7/2022 | Koopman ............ G06V 10/764 |
| 2006/0066855 | A1 | 3/2006 | Den Boef et al. |
| 2009/0157360 | A1 | 6/2009 | Ye et al. |
| 2011/0027704 | A1 | 2/2011 | Cramer et al. |
| 2011/0043791 | A1 | 2/2011 | Smilde et al. |
| 2012/0242970 | A1 | 9/2012 | Smilde et al. |
| 2017/0200260 | A1 | 7/2017 | Bhaskar et al. |
| 2017/0357911 | A1 | 12/2017 | Liu et al. |
| 2018/0267523 | A1 | 9/2018 | Sigtermans et al. |
| 2018/0314163 | A1 | 11/2018 | Liu |

FOREIGN PATENT DOCUMENTS

| | | |
|---|---|---|
| TW | 201723709 | 7/2017 |
| TW | 201734825 | 10/2017 |
| WO | 2009078708 | 6/2009 |
| WO | 2009106279 | 9/2009 |
| WO | 2016096309 | 6/2016 |

OTHER PUBLICATIONS

Chen, L-C et al.: "DeepLab: Semantic Image Segmentation with Deep Convolutional Nets, Atrous Convolution, and Fully Connected CRFs", Proc. of SPIE, vol. 10524, Jul. 13, 2017.

Watanabe, Y. et al.: "Accurate Lithography Simulation Model based on Convolutional Neural Networks", Proc. of SPIE, vol. 10454, 2017.

Yang, H. et al.: "Imbalance Aware Lithography Hotspot Detection: A Deep Learning Approach", Proc. of SPIE, vol. 10148, Mar. 28, 2017.

Jia, N. et al.: "Machine learning for inverse lithography: using stochastic gradient descent for robust photomask synthesis", Journal of Optics, vol. 12, No. 4, Apr. 1, 2010.

Ding, D. et al.: "Machine Learning based Lithographic Hotspot Detection with Critical-Feature Extraction and Classification", IC Design and Technology, 2009, IEEE, pp. 219-222, May 18, 2009.

Woldeamanual, D.S. et al.: Application of deep learning algorithms for lithographic mask characterization, Proc. of SPIE, vol. 10694, May 25, 2018.

Korean Office Action issued in corresponding Korean Patent Application No. 10-2020-7024360, dated Dec. 16, 2021.

Watanabe, Y. et al.: "Accurate lithography simulation model based on convolutional neural networks", Proc. of SPIE, vol. 10454 (Jul. 13, 2017).

Matsunawa, T. et al.: "Automatic layout feature extraction for lithography hotspot detection based on deep neural network", Proc. of SPIE, vol. 9781 (Mar. 16, 2016).

Taiwanese Office Action issued in corresponding Taiwanese Patent Application No. 109127236, dated Mar. 4, 2021.

Office Action issued in corresponding Korean Patent Application No. 10-2023-7004700, dated Mar. 8, 2023.

* cited by examiner

DEEP LEARNING FOR SEMANTIC SEGMENTATION OF PATTERN

This application is a continuation of U.S. patent application Ser. No. 16/968,966 which was filed on Aug. 11, 2020, now allowed, which is the U.S. national phase entry of PCT Patent Application No. PCT/EP2019/053803, which was filed on Feb. 15, 2019, which claims the benefit of priority of U.S. Patent Application No. 62/634,540, which was filed on Feb. 23, 2018, each of the foregoing applications is incorporated herein in its entirety by reference.

FIELD

The present disclosure relates to techniques of improving the performance of a device manufacturing process. The techniques may be used in connection with a lithographic apparatus or a metrology apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

According to an embodiment, there is provided a method for training a deep learning model of a patterning process. The method includes obtaining (i) training data comprising an input image of at least a part of a substrate having a plurality of features and a truth image corresponding to the input image, (ii) a set of classes, each class corresponding to a feature of the plurality of features of the substrate within the input image, and (iii) a deep learning model configured to receive the training data and the set of classes, generating a predicted image, by modeling and/or simulation of the deep learning model using the input image, wherein the deep learning model iteratively performs a convolution operation with at least one dilation kernels comprising a plurality of weights, assigning a class of the set of classes to a feature within the predicted image based on matching of the feature with a corresponding feature within the truth image, and generating, by modeling and/or simulation, a trained deep learning model by iteratively assigning weights to the at least one dilated kernel based on a back propagation through the deep learning model using a loss function such that the predicted image reproduces the plurality of features of the input image.

In an embodiment, the convolution operation comprises overlapping the input image with the at least one dilation kernel, determining a product between each overlapping elements including a weight of the at least one dilation kernel and a value of a pixel of the input image, and summing results of the product to determine a value of the convolution operation.

In an embodiment, the at least one dilation kernel comprises a plurality of weights, a dilation rate, and a depth, wherein the depth is a multiple of a number of classes of the set of classes.

In an embodiment, the loss function is a function of the truth image and a probability of each class of the set of classes assigned to the predicted image.

In an embodiment, the iteratively assigning weights comprises modifying the plurality of weights of the dilated kernel, the dilation rate, and/or the depth to characterize at least a part of the patterning process based on a local derivative of the loss function.

In an embodiment, the at least one dilation kernel comprises a first dilation kernel of the at least one dilation kernel comprises a first set of weights, a first dilation rate and a depth equal to a number of classes of the set of classes, a second dilation kernel of the at least one dilation kernel comprises a second set of weights, a second dilation rate and a depth equal to a number of classes of the set of classes, wherein the second set of weights is different from the first set of weights and/or the second dilation rate is different from the first dilation rate.

In an embodiment, the first dilation kernel characterizes a first part of the patterning process, and a second kernel characterizes a second part of the patterning process, in which the second part is a projection system of the patterning process and the second part is a parameter related to the feature of the substrate.

In an embodiment, the dilated kernel is symmetric to characterize a projection system of an apparatus of the patterning process.

In an embodiment, the iteratively assigning weights comprises assigning a first set of weights to the plurality of weights of the dilated kernel to characterize a projection system of an apparatus of the patterning process.

In an embodiment, the dilation rate is an integer value between 1 and 10.

Furthermore, according to an embodiment, there is provided a method of applying a trained deep learning model to a patterning process. The method including obtaining (i) the trained deep learning model, (ii) a set of classes, each class corresponding to a feature of a training substrate used for training the trained deep learning model, and (iii) an input image of at least part of a substrate undergoing the patterning process having a plurality of features, generating a segmented image by modeling and/or simulation of the trained deep learning model using the input image and the set of classes, wherein the plurality of features of the input image are reproduced in the segmented image, and determining a parameter of the patterning process based on the plurality of features of the segmented image.

In an embodiment, generating a segmented image comprises assigning a class of the set of classes to each pixel of the segmented image, in which the label corresponds to a feature of the set of features having maximum probability, and the segmented image is pixelated.

In an embodiment, each pixel of the segmented image is associated with information comprising the set of classes, a set of probabilities corresponding to each class of the set of classes, and a location on the segmented image.

In an embodiment, determining a parameter of the patterning process comprises performing measurements on the plurality of features within the segmented image, the measurements comprises a feature dimension, and/or a distance between one or more features of the plurality of features; and determining the parameter based on the measurements related to the plurality of features.

In an embodiment, the parameter is an edge placement error, overlay, a line edge roughness, necking, and/or CD.

In an embodiment, the method further includes determining an adjustment to the patterning process, based on the parameter related to a feature, and responsive to the adjustment, adjusting the patterning process.

In an embodiment, the adjustment includes adjustment to a process variable including dose and/or focus.

DETAILED DESCRIPTION

Before describing embodiments in detail, it is instructive to present an example environment in which embodiments may be implemented.

Figure 1:
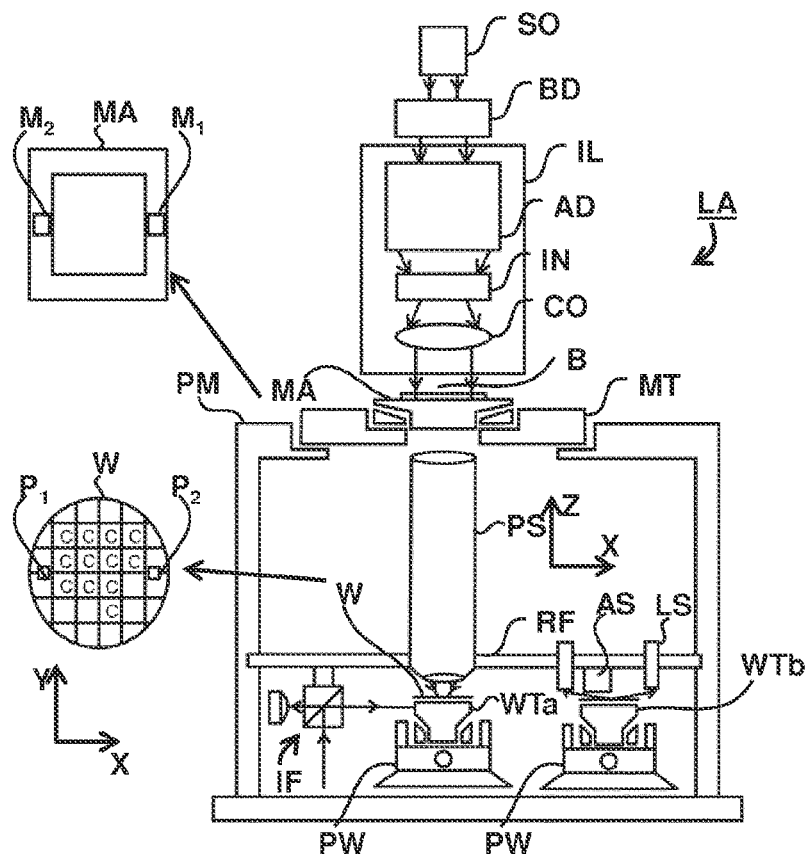
FIG. 1 schematically depicts a lithography apparatus according to an embodiment.

FIG. 1 schematically depicts an embodiment of a lithographic apparatus LA. The apparatus comprises:

an illumination system (illuminator) IL configured to condition a radiation beam B (e.g. UV radiation, EUV or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CODs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:
1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
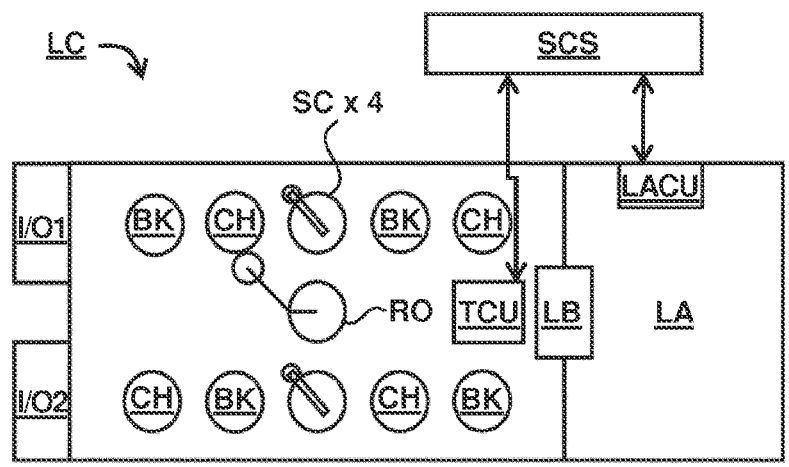
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
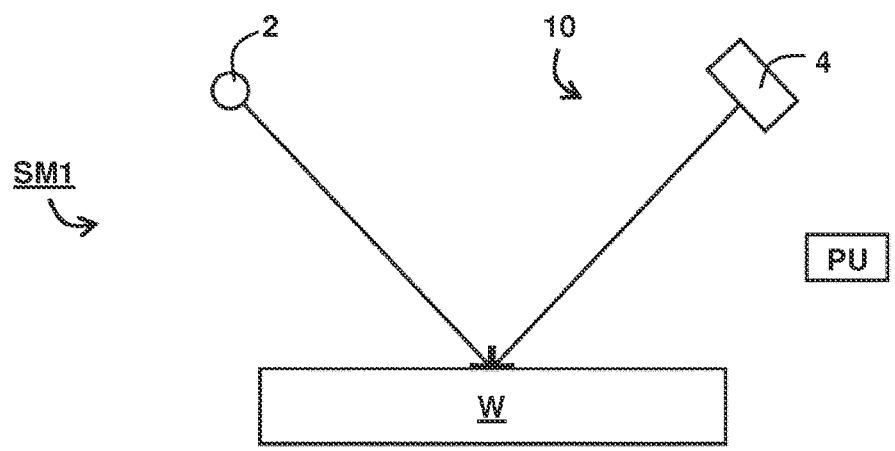
FIG. 3 schematically depicts an example inspection apparatus and metrology technique.
Figure 3:
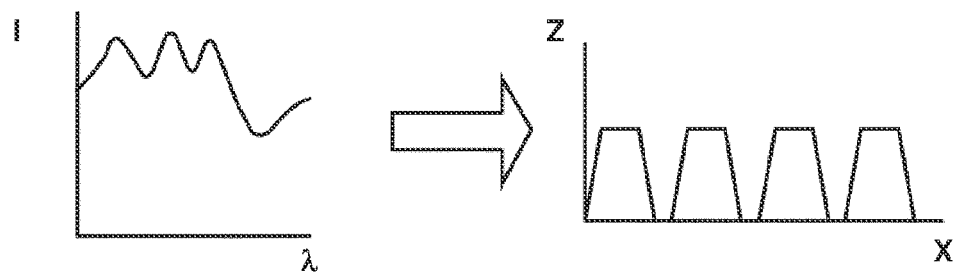

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
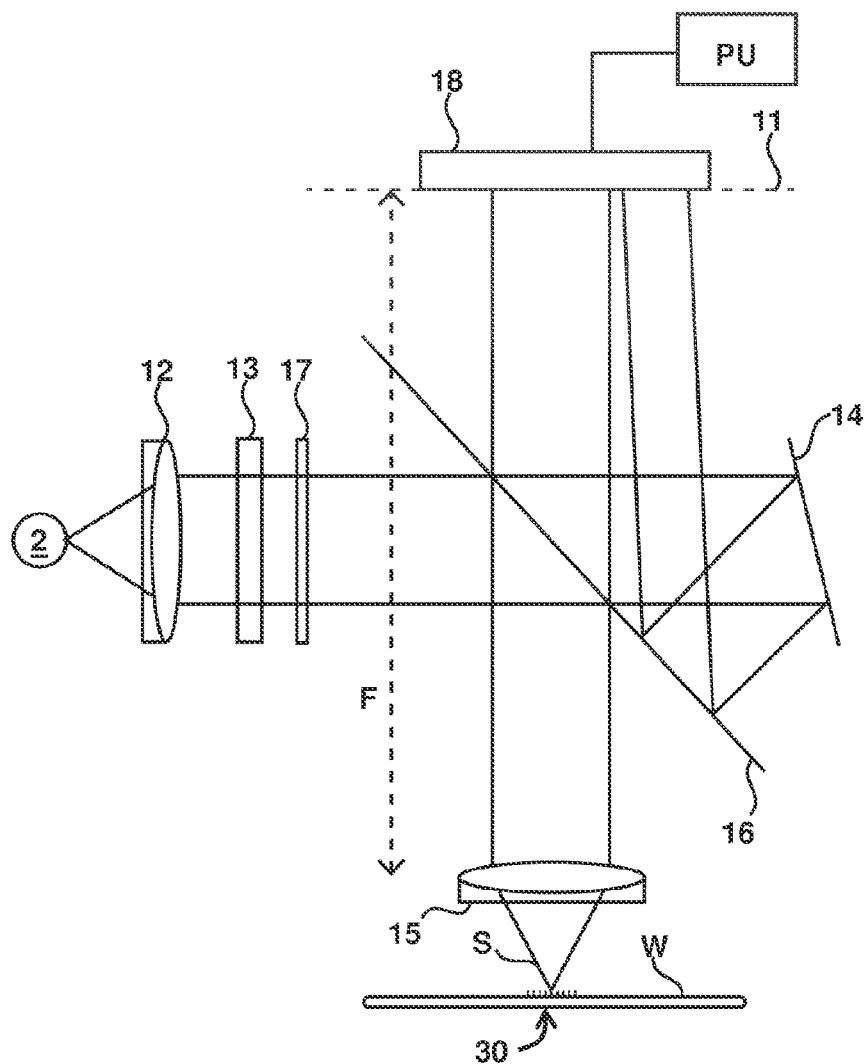
FIG. 4 schematically depicts an example inspection apparatus.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
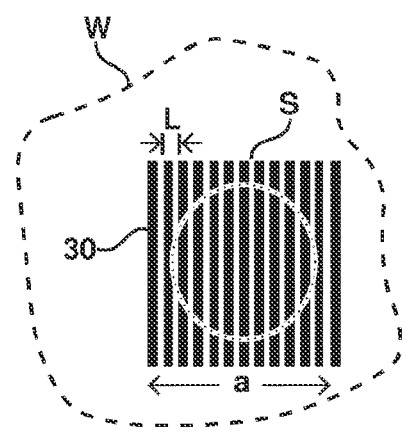
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
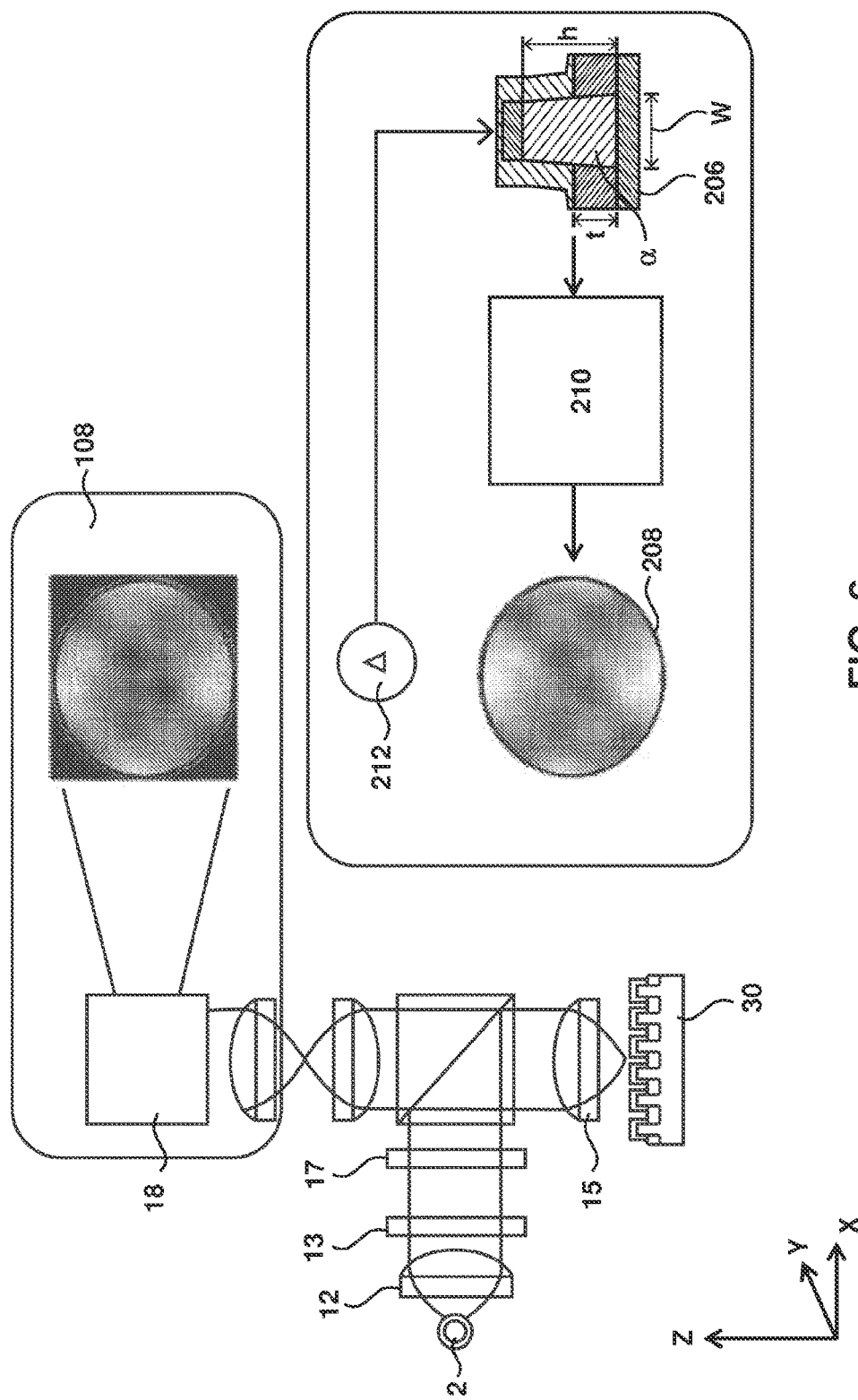
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
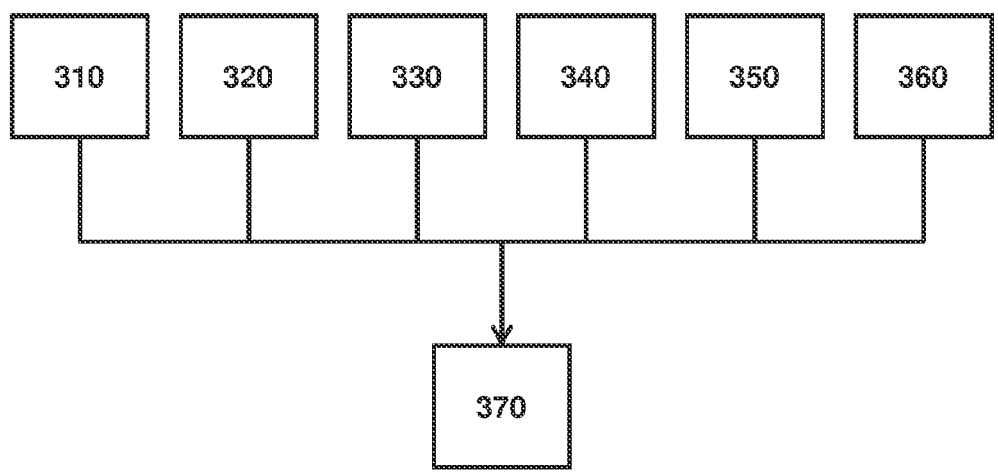
FIG. 7 shows example categories of processing variables.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Figure 8:
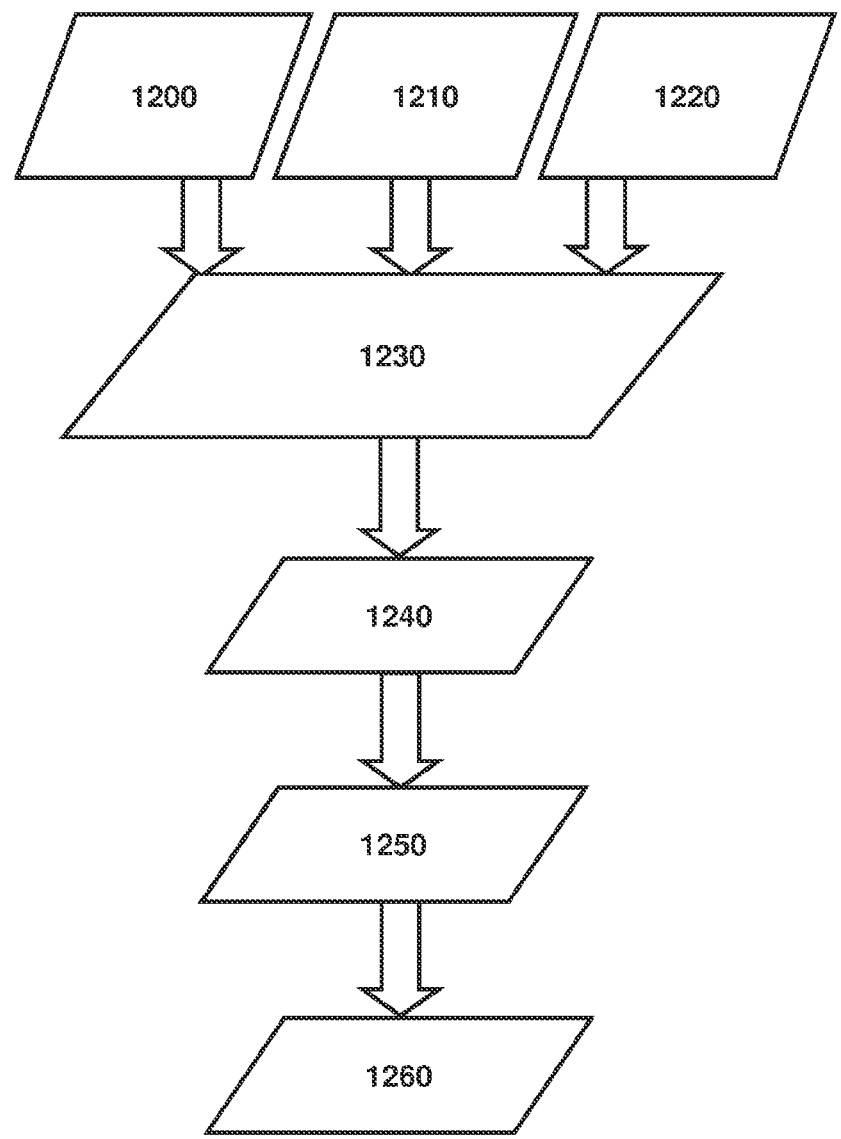
FIG. 8 schematically shows a flow for a method, according to an embodiment.

An exemplary flow chart for modelling and/or simulating parts of a patterning process is illustrated in FIG. 8. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where □ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Figure 9:
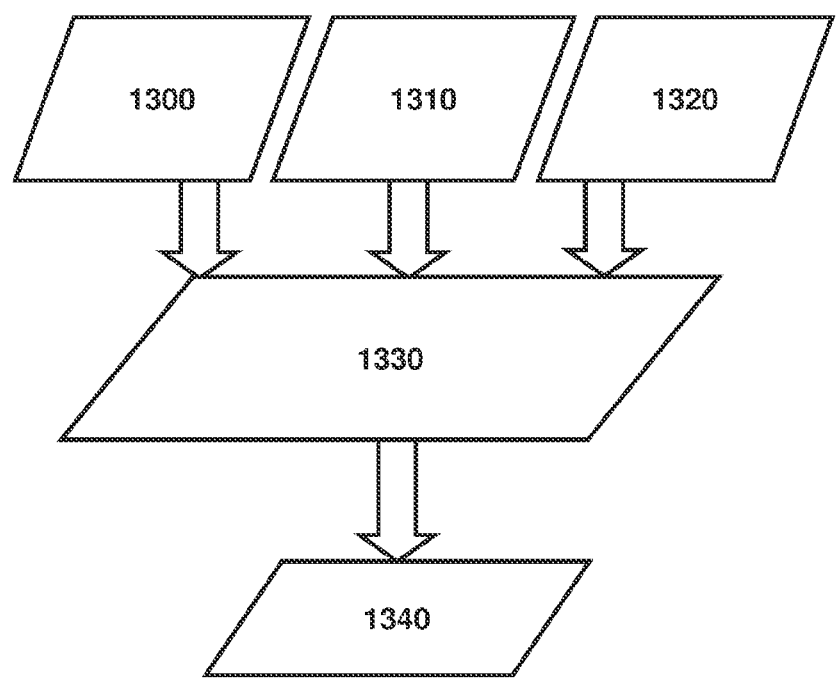
FIG. 9 schematically shows a flow for a method, according to an embodiment.

An exemplary flow chart for modelling and/or simulating a metrology process is illustrated in FIG. 9. As will be appreciated, the following models may represent a different metrology process and need not comprise all the models described below (e.g., some may be combined). A source model 1300 represents optical characteristics (including radiation intensity distribution, radiation wavelength, polarization, etc.) of the illumination of a metrology target. The source model 1300 can represent the optical characteristics of the illumination that include, but not limited to, wavelength, polarization, illumination sigma (σ) settings (where ☐ (or sigma) is a radial extent of illumination in the illuminator), any particular illumination shape (e.g. off-axis radiation shape such as annular, quadrupole, dipole, etc.), etc.

A metrology optics model 1310 represents optical characteristics (including changes to the radiation intensity distribution and/or the phase distribution caused by the metrology optics) of the metrology optics. The metrology optics 1310 can represent the optical characteristics of the illumination of the metrology target by metrology optics and the optical characteristics of the transfer of the redirected radiation from the metrology target toward the metrology apparatus detector. The metrology optics model can represent various characteristics involving the illumination of the target and the transfer of the redirected radiation from the metrology target toward the detector, including aberration, distortion, one or more refractive indexes, one or more physical sizes, one or more physical dimensions, etc.

A metrology target model 1320 can represent the optical characteristics of the illumination being redirected by the metrology target (including changes to the illumination radiation intensity distribution and/or phase distribution caused by the metrology target). Thus, the metrology target model 1320 can model the conversion of illumination radiation into redirected radiation by the metrology target. Thus, the metrology target model can simulate the resulting illumination distribution of redirected radiation from the metrology target. The metrology target model can represent various characteristics involving the illumination of the target and the creation of the redirected radiation from the metrology, including one or more refractive indexes, one or more physical sizes of the metrology, the physical layout of the metrology target, etc. Since the metrology target used can be changed, it is desirable to separate the optical properties of the metrology target from the optical properties of the rest of the metrology apparatus including at least the illumination and projection optics and the detector. The objective of the simulation is often to accurately predict, for example, intensity, phase, etc., which can then be used to derive a parameter of interest of the patterning process, such overlay, CD, focus, etc.

A pupil or aerial image 1330 can be simulated from the source model 1300, the metrology optics model 1310 and the metrology target model 1320. A pupil or aerial image is the radiation intensity distribution at the detector level. Optical properties of the metrology optics and metrology target (e.g., properties of the illumination, the metrology target and the metrology optics) dictate the pupil or aerial image.

A detector of the metrology apparatus is exposed to the pupil or aerial image and detects one or more optical properties (e.g., intensity, phase, etc.) of the pupil or aerial image. A detection model module 1320 represents how the radiation from the metrology optics is detected by the detector of the metrology apparatus. The detection model can describe how the detector detects the pupil or aerial image and can include signal to noise, sensitivity to incident radiation on the detector, etc. So, in general, the connection between the metrology optics model and the detector model is a simulated pupil or aerial image, which arises from the illumination of the metrology target by the optics, redirection of the radiation by the target and transfer of the redirected radiation to the detectors. The radiation distribution (pupil or aerial image) is turned into detection signal by absorption of incident energy on the detector.

Simulation of the metrology process can, for example, predict spatial intensity signals, spatial phase signals, etc. at the detector or other calculated values from the detection system, such as an overlay, CD, etc. value based on the detection by the detector of the pupil or aerial image. Thus, the objective of the simulation is to accurately predict, for example, detector signals or derived values such overlay, CD, corresponding to the metrology target. These values can be compared against an intended design value to, e.g., correct the patterning process, identify where a defect is predicted to occur, etc.

Thus, the model formulation describes most, if not all, of the known physics and chemistry of the overall metrology process, and each of the model parameters desirably corresponds to a distinct physical and/or chemical effect in the metrology process.

As discussed above, simulation of the patterning process can be used to predict parameters, for example, predict contours, CDs, edge placement (e.g., edge placement error), etc. in the resist and/or etched image. However, such prediction, for example, of edge placement error (EPE) is based on contour extraction with high accuracy, since the contour is believed to represent the related object boundary well. Typically, contouring techniques rely on a careful tuning of parameters of the contouring algorithm where the optimal parameters often depend on the image, and as a result lead to between-image variance of the resulting contour. In other words, for each image acquired during the patterning process, the contouring algorithm needs to be tuned even when the features may be similar to previously acquired image. The contouring techniques also rely on de-noising of the image such that the image gradient is smoothed, and although techniques exist that do not blur the image spatially (e.g. Chan-Vese levelset), these methods also rely on carefully chosen parameters of de-noising algorithm. Thus, the contouring techniques rely on manual and ad-hoc signal processing that may not be robust and/or reusable without tuning for newly acquired images.

The present disclosure includes methods using machine learning that may overcome several problem of the contouring technique, for example, as discussed above. In an embodiment, a method based on a semantic segmentation of an image of at least a part of a patterned substrate rather than finding a contour (the latter could be derived from the segmentation if needed) is discussed. Furthermore, the present disclosure includes a method for training machine learning model (specifically a convolutional neural network) to identify a deep learning model that performs semantic segmentations based on raw input images (i.e., without performing de-noising). Although, in an embodiment, the input image provided may be pre-processed to remove noise data.

Methods employing machine learning technology may be used to improve prediction of process parameters based on recognition of patterns and features present within acquired data (e.g., a SEM image, measurements, and context data). Additionally, machine learning techniques may be useful to guide a user in selecting patterning process data (e.g., processing window, dose, focus, CD, etc.) that is most useful for control of patterning process to improve yield and accuracy of the patterning process.

Both unsupervised machine learning and supervised machine learning models may be used to identify features. Without limiting the scope of the invention, applications of supervised machine learning algorithms are described below.

Supervised learning is the machine learning task of inferring a function from labeled training data. The training data includes a set of training examples. In supervised learning, each example is a pair having an input object (e.g., a pixelated input image typically represented as in a tensor or a vector form) and a desired output value (also called the supervisory signal). A supervised learning algorithm analyzes the training data and produces an inferred model, which can be used for mapping new examples. An optimal scenario will allow the algorithm to correctly determine the output for unseen instances. This requires the learning algorithm to generalize from the training data to unseen situations in a "reasonable" way.

Exemplary models of supervised learning include decision trees, ensembles (bagging, boosting, random forest), k-NN, linear regression, naive Bayes, (deep) neural networks, logistic regression, support vector machine (SVM), and relevance vector machine (RVM).

Deep learning refers to training a neural network that consists of multiple layers, and can be either supervised or unsupervised. In an embodiment, a deep learning model may be based on architectures such as residual nets, convolution neural networks, deep belief networks and recurrent neural networks. In an architecture based on convolutions, each layer performs certain convolution operations based on one or more kernels (typically defined by weights associated with the kernels). During the training process, the deep learning model may be modified by adjusting the kernels (i.e. changing the kernel weight values).

A convolutional neural network typically consist of several layers chained together in a subsequent manner, such that information flows from input to output. Effectively, each layer takes in a tensor Tin and outputs a new tensor Tout. The input tensor is convolved with a kernel tensor W, the resulting convolution may be increased with a bias vector and passed through an activation function such as a rectified linear unit (ReLU). In the present disclosure, one or more dilated kernels may be used in order to increase the receptive field without doing max-pooling (since it may deteriorate spatial resolution). The dilated kernel is a kernel used with the dilation operation. Typically, a max-pooling is an operation that uses the maximum value from each of a cluster of neurons at the prior layer.

The deep learning model needs to be trained, and object (or features within an image) labels may be domain specific. As such, in an embodiment, a set of training data is generated or obtained based on some ground truth. Such ground truth may include a set of raw input images together with output images, where each pixel has been assigned an object label. By using data augmentation (e.g., taking random crops out of the ground truth and translating, rotating, scaling, etc.) a training set with sufficient variation and volume may be generated.

The following disclosure describes a method for training a deep learning model to accurately perform semantic segmentation of an image (e.g., a gray-scale SEM image). For example, an objective of the present method is to assign to each image pixel x, a label L(x) from a set of predetermined labels L via convolutional neural networks (deep learning), and specifically dilated residual neural networks. In the present disclosure, the term label is used interchangeably with a class or a feature of a substrate to generally refer to a particular feature of a substrate.

Figure 10:
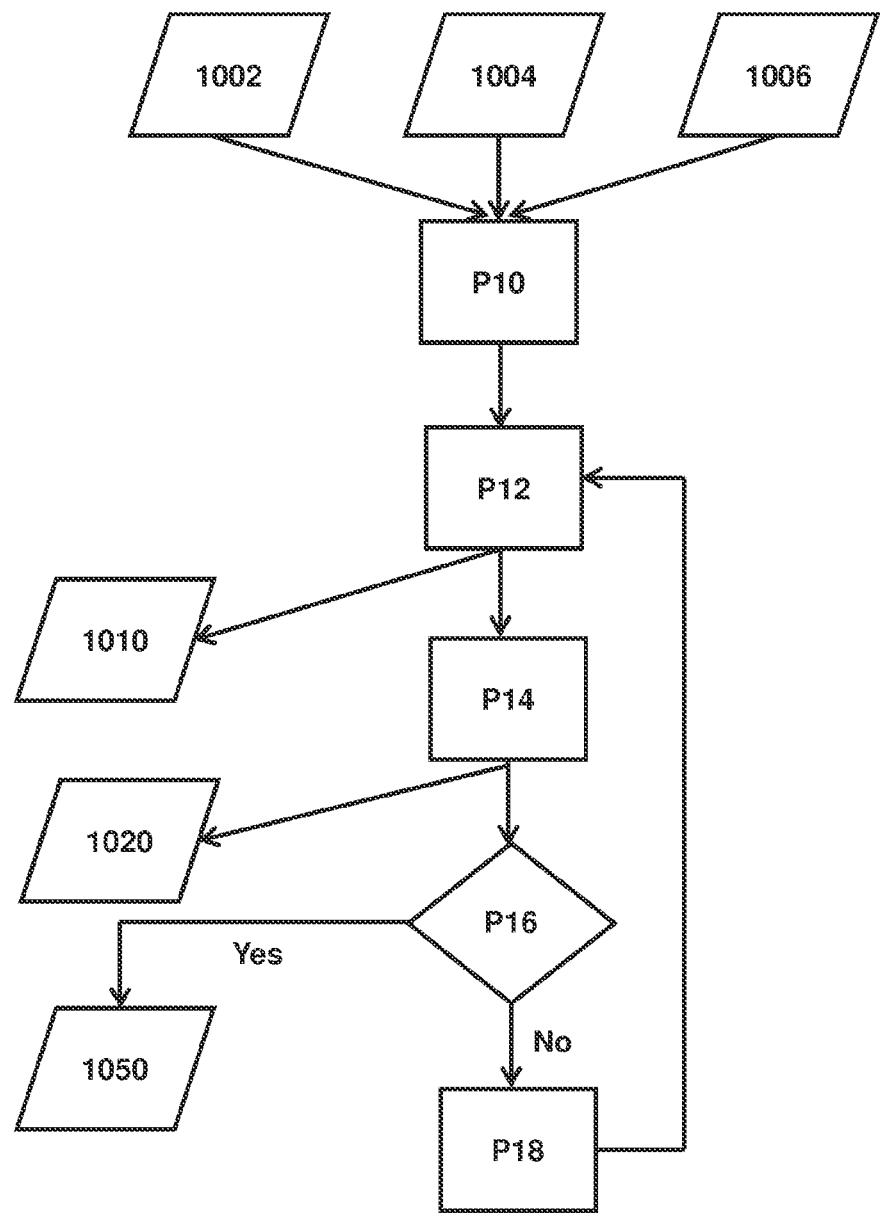
FIG. 10 schematically shows a flow for a method of training a deep learning model, according to an embodiment.

FIG. 10 illustrates a flow chart of a method for training a deep learning model. As mentioned earlier, the deep learning model comprises of a neural network having several layers that are chained together in a subsequent manner. Each layer performs convolution operations with (dilated) kernels. Dilated kernels enlarge the receptive field of an input image and preserves the spatial resolution of the input image and hence the features within it. This enables accurate labeling of even the smallest features of a substrate. As such, the trained deep learning model is capable of detecting and accurately labeling features of small size such as less than 20 nm. In other words, in an embodiment the model can segment an image at a pixel level, which can be significantly smaller than 20 nm.

The trained deep learning model may be used to perform semantic segmentation of, for example, SEM images obtained during the patterning process and determine various features and parameters of the patterning process by performing measurements of the features identified in a segmented image of the SEM image.

The deep learning model (e.g., 1006) uses the training data (e.g., 1002) and the set of classes (e.g., 1004) to train a set of neural network so that the trained deep learning model may predict different features of any input image (e.g., a part of patterned substrate or a target image) and label each feature within the input image to produce a segmented image that accurately mimics the input image (e.g., more than 99% match (e.g., a mean dice score) between the features of the target image and the segmented image). The training involves a forward propagation of an input through different layers of the neural network to reach an output, where each layer performs a convolution operations with dilated kernels. However, especially in a first forward pass, the output at the last layer may deviate from the ground truth. This deviation is characterized by a loss function (or cost function or objective function) to quantify the amount of deviation between the target and output images. For example, the features of the ground truth image may not match the features of the output image. To minimize the deviation, the loss gradient with respect to the weights is back propagated through the different layers of the network (i.e. from the last layer to the first layer of the neural network). In this manner, the localized derivative of the loss function with respect to weights at a particular layer (e.g., 15th layer output of 25 layers of the neural network) can be determined. Based on the derivative of the localized function, the weights of that particular layer (e.g., the 15th layer) may be adjusted so as to minimize the loss function. In order words, to minimize the deviation in the output. During the training process, the deep learning model 1006 may generate several intermediate images at each hidden layer of the neural network, generally referred as an output tensor 1010 for discussion purposes. The training of the deep learning model 1006 may begin with an initialization of weights of each layer and progressively modifying the weights based on backpropagation of the error signal with respect to the loss function.

In an embodiment, the training process starts at process P10. In process P10, the deep learning model 1006, training data 1002, and a set of classes 1004 (i.e. labels) may be obtained and/or generated.

The training data 1002 includes an input image 1000 (e.g., an input image 1100 in FIG. 11) of at least a part of a substrate having a plurality of features and a truth image 1001 (e.g., a truth image 1130 in FIG. 11) corresponding to the input image 1000. Typically, a set of input images having different types of features and a corresponding set of truth images may be used as training data to train the deep learning model 1006. Since the deep learning model 1006 needs to be trained, and the labels are domain specific, a set of training data may be generated based on some ground truth (i.e., the truth image 1001), for example, as discussed earlier, by using data augmentation (e.g., taking random crops out of such ground truth and translating, rotating, scaling, etc.) to generate a training set with sufficient variation.

Figure 12:
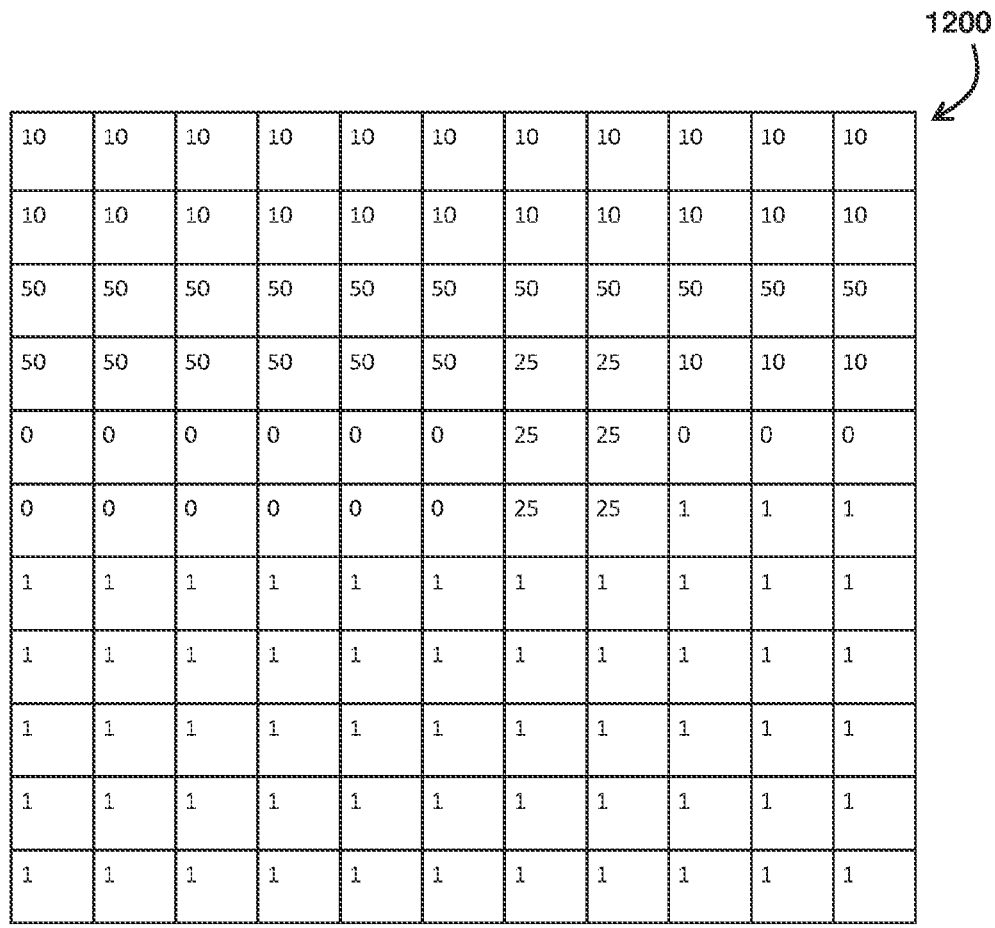
FIG. 12 illustrates an example of a pixelated input image used for training the deep learning model, according to an embodiment.

The input image 1000 may be a pixelated image which can be represented in the form of a tensor or a vector to enable various mathematical operation (e.g., convolution, addition, multiplication, rotation, scaling, etc.) and statistical analysis of each pixel of the input image 1000. Furthermore, based on the analysis, each pixel may be labelled (e.g., with one or more classes). In an embodiment, the input image 1000 can be a SEM image (i.e., a grey-scale image) of at least part of a patterned substrate obtained during or after the patterning process. Each pixel of the SEM image may have a grey-scale value such as a pixelated input image 1200 illustrated in FIG. 12. In an embodiment, the input image 1000 may be represented as an input tensor having dimensions (b, w, h, c), where b represents a batch size (e.g., total number of images used for training), w represents a width of the input image (or a tensor), h represents the height of the input image (or a tensor), c represents a channel (i.e., number of classes/labels/features). In an embodiment, an n-th order tensor X can be defined as X=R^a1 \times a2\times . . . \times an, where ai is the size of the i-th order.

The ground truth image 1001 (or a set of ground truth images) is a segmented image of the input image 1000 used to establish a ground truth for the input image 1000 (or a set of input images) so that together these images can be used to train the deep leaning model 1006 (e.g., a convolution neural networks with dilation kernels). In an embodiment, such semantic segmentation may be performed manually, where each pixel of the truth image 1001 is manually assigned a label (i.e., a class or a feature of a patterned substrate). In an embodiment, the labels (i.e., classes) may be for example, such as a contact hole, a line, a bar, a grating, an oxide layer, a CD, etc. Similar to the input image 1000, the truth image 1001 may be represented as in the form of a tensor or a vector.

Furthermore, the process P10, may obtain a set of classes 1004, each class corresponding to a feature of the plurality of features of a substrate within the input image 1000 of the substrate. Each class may be a label which may be a name of a feature, a color, or other appropriate identifier. For example, a set of classes 1004 may be contact hole, a line, a bar, a grating, an oxide layer, a CD, or other feature that may appear on a patterned substrate. During the training process, each pixel of a predicted image may be assigned one or more labels from the set of labels. Furthermore, each label may be associated with a probability distribution providing a measure of confidence in assigning the label to, for example, a feature of the substrate. Furthermore, each of the labels may be associated with a color to generate a segmented image with labels represented as colors (e.g., purple for a grating, black for an oxide layer, yellow for a power rail, green for a bar, etc.). Such color coding enables ease of identification of different features of the substrates, perform measurements such as CD, area, overlay, EPE, line edge roughness, etc.

The deep learning model 1006 may be a neural network configured to receive the training data and perform (e.g., by modeling and/or simulation) convolution with dilated kernels. The neural network includes a plurality of layers that are chained together in a subsequent manner. A layer of the plurality of layers may be include a number of interconnected nodes which contain an 'activation function'. An activation function non-linearly maps elements (e.g., values related a pixels of an input image) of an input tensor to an output tensor. For example, the activation function may be a non-linear function or a linear function such as a sigmoid (see equation 1 below) or rectified linear unit (ReLU).

$$a = \sigma\left(\sum_i w_i x_i - \theta\right) \quad (1)$$

In equation (1) above, (i) a is the activation is the activation function, which can be a sigmoid function, (ii) $w_i$ is a weight of the $i^{th}$ element of the input tensor, (iii) $x_i$ is the value of the $i^{th}$ element of the input tensor, and (iv) $\theta$ is a bias. The set of all weights and biases may also be referred as model parameters. Such activation function is typically a non-linear function which enables the deep learning model 1006 to generalize or adapt with variety of data (e.g., different pixels of the input tensor). The non-linear activation functions allow to define a rich model class that contains models that are effective, for example, for computer vision based tasks. During the training process, the weights may be initialized to random values (e.g., based on Gaussian distribution between 0 to 1) and during the training process such weights may be optimized via backpropagation and specific update rules (e.g., Adam update rule). The optimization using a loss function and backpropagation is discussed later in the disclosure. The weights may be updated so as to identify a particular feature of the input image 1000 accurately, so that the trained deep learning model can reproduce the features of the input image 1000. The present disclosure is not limited to a type of activation function. For example, alternatively or in addition, a softmax function may be used. In an embodiment, the softmax is used to map activation to a probability distribution like activation, and therefore is used at the final layer where these values can be interpreted.

Each layer of the plurality of layers of the neural network of the deep learning model 1006 may receive the input image 1000 in the form of a tensor (or a vector) and output a new tensor (also referred as a predicted image obtained at the final layer). The input tensor may be convolved with a dilation kernel tensor W, the result of the convolution may be increase (or decreased) with a bias and passed through the activation function such as the sigmoid function or a rectified linear unit (ReLU).

Further, the training process, in process P12, involves generating a predicted image, by application of the deep learning model 1006 using the input image 1000 of the training data. In an example, the output tensor 1010 or a predicted image refers to an output tensor of a last layer of the deep learning model 1006. In another example, the output tensor 1010 may be an output tensor of an intermediate layer of the deep learning model 1006. The generation of the output tensor 1010 involves iteratively performing a convolution operation with the at least one (dilation) kernel at each layer of the deep learning model 1006. The convolution operation comprises overlapping a portion of the input image 1000 with a dilation kernel, taking a product between each overlapping elements including a weight of the dilation kernel and a value of a pixel of the input image 1000, and summing the results of the product. For example, in FIG. 14A, a first 3×3 dilation kernel 1410 overlaps with a pixelated input tensor 1400, each of the element of the dilation kernel overlapping with a pixel of the input tensor. Then, a product of values of each of the overlapping element (e.g., a value of the pixel and a weight of the kernel) may be computed and further the products may be summed to determine an element of the output tensor. Furthermore, the first dilation kernel may then be shifted by one stride (e.g., by a column of one pixel to the right) and similar convolution operation is performed on a new overlapping elements of the input tensor and the kernel element (i.e., weights) to determine a second element of the output tensor.

In an embodiment, iteratively performing the convolution may involve performing a plurality of convolution operations with one or more dilation kernels within a particular layer on an input tensor for that layer. For example, a first layer may receive the input tensor (e.g., a representation of the input image such as 1200 in FIG. 12). On the input tensor, the first layer performs a convolution operation using a first dilation kernel. The first dilation kernel having a first set of weights (e.g., of kernel 1310 in FIG. 13B). The result of the convolution is a first output tensor (e.g., 1115a in FIG. 11), which is passed through a first activation function of the first layer to a second layer. Similar to the first layer, the second layer also performs a convolution operation using a second dilation kernel. The second dilation kernel having a second set of weights, which may be the same or different from the first set of weights of the first kernel. The output of the second layer may be a second output tensor (e.g., 1115e in FIG. 11). In an embodiment, the first kernel and the second kernel itself may be different which will result in different output tensors.

The present disclosure is not limited to one convolution operation with one dilated kernel per layer. The training process may involve convolution of the input tensor with a plurality of dilation kernels per layer of the deep learning model 1006, resulting in a plurality of output tensors. For example, in FIG. 11, a first layer may output four different output tensors 1115a, 1115b, 1115c and 1115d, each resulting from convolution with different dilation kernels such as a first dilation kernel having dilation rate 1 and depth of 2c, and a second dilation kernel having a dilation rate of 2 and depth of 2c. Similarly, a second layer may output four different output tensors 1115e, 1115f, 1115g and 1115h, each resulting from convolution with different respective dilation kernels such as a third dilation kernel having dilation rate 2 and depth of 4c, and a fourth dilation kernel having a dilation rate of 4 and depth of 4c.

Figure 13A:
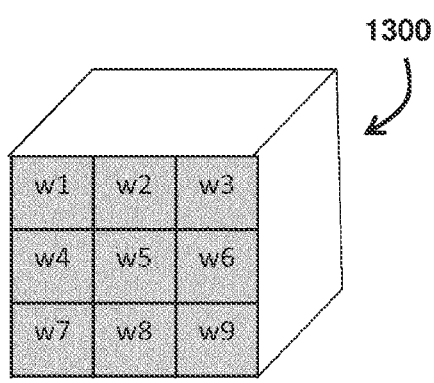
FIG. 13A illustrates an example of a dilated kernel used for training the deep learning model, according to an embodiment.
Figure 13B:
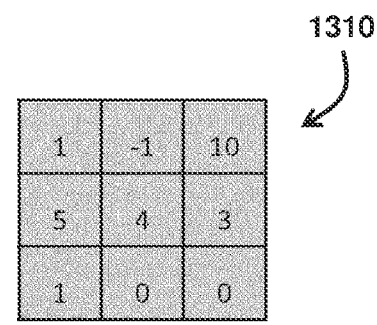
FIG. 13B illustrates an example weights of a dilated kernel used for training the deep learning model, according to an embodiment.
Figure 14A:
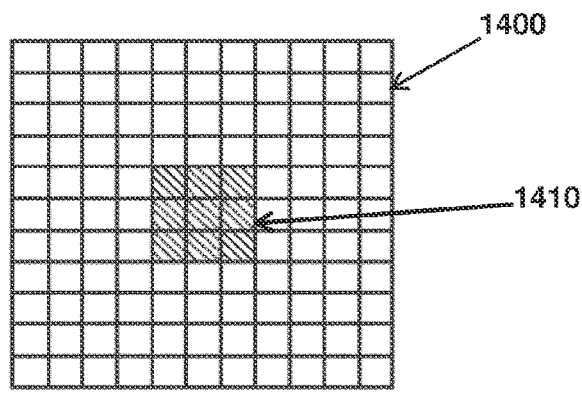
FIG. 14A illustrates an example convolution operation with a first dilated kernel for training the deep learning model, according to an embodiment.
Figure 14B:
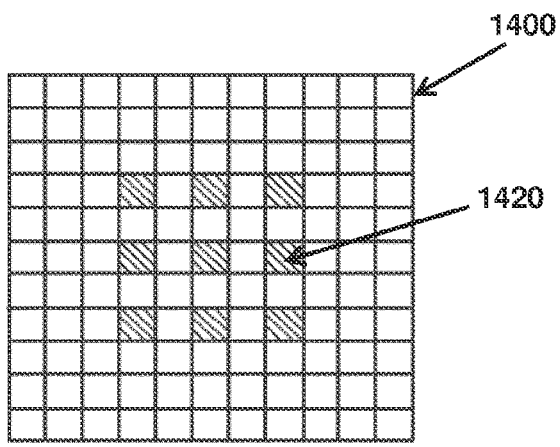
FIG. 14B illustrates an example convolution operation with a second dilated kernel for training the deep learning model, according to an embodiment.
Figure 14C:
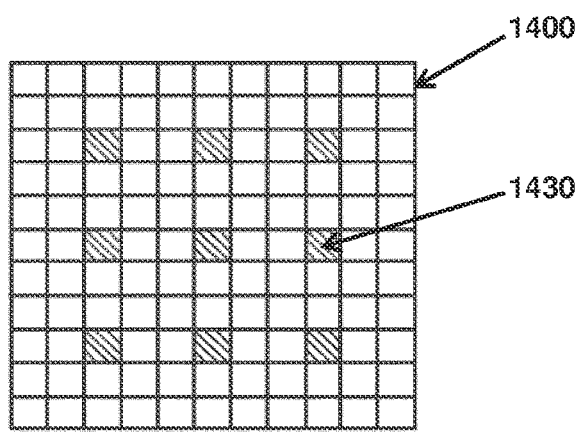
FIG. 14C illustrates an example convolution operation with a third dilated kernel for training the deep learning model, according to an embodiment.

In an embodiment, a dilation kernel may be characterized by a plurality of weights, depth (i.e., class), a dilation rate, or a combination thereof. In an embodiment, the dilation rate is a parameter related to the model/architecture, one could consider this a hyperparameter. In an embodiment the 'best' value of the dilation rate is determined empirically; that is consider different architectures and choose a value for which a model/architecture performs best with respect to the loss function. In a first pass, the weights may be randomly assigned (e.g., based on Gaussian distribution between 0 and 1) and later modified during the training process. The dilation rate may be an integer value, for example, between 1 and 10, which is chosen at the start of the training process and remain fix during the training process. For example, FIG. 13A illustrates a dilated kernel 1300 in the form of a 3×3 grid each element of the grid having a particular weight (e.g., w1-w9). The dilated kernel 1300 also has a depth D (e.g., a total number of features (e.g., depth D is equal to number of classes at the final layer). Any dilated kernel such as 1300 may also be represented in the form a tensor, also referred as weight tensor (or weight kernel). In another example, FIGS. 14A-14C illustrate examples of different dilation kernels such as the first 3×3 dilation kernel 1410 having a dilation rate of 1 (in FIG. 14A), a second 3×3 dilation kernel 1420 having a dilation rate of 2 (in FIG. 14B), and a third 3×3 dilation kernel 1430 having a dilation rate of 3 (in FIG. 14C).

In an embodiment, the dilation kernel may be configured or constrained for a part of the patterning process. For example, the dilated kernel may be symmetric to characterize a projection system of an apparatus of the patterning process. For example, in a 3×3 dilated kernel the center element (i.e., (2,2)) may be considered as origin, and the origin may be overlapped with a particular pixel of the pixelated input image. In an embodiment, the kernels are constrained such that the kernels mimic aberration like effects. In embodiment, as a non-limiting example the constrained may be a spherical kernel constraint, or point symmetry—similar to Zernikes.

In an embodiment, a plurality of dilated kernels may be used such that one or more dilated kernels may be configured to characterize a part of the patterning process. For example, a first dilation kernel of the plurality of dilation kernels may include a first set of weights, a first dilation rate, and a depth equal to a number of classes of the set of classes 1004. A second dilation kernel of the plurality of dilation kernels may include a second set of weights, a second dilation rate, and a depth equal to a number of classes of the set of classes 1004. In an example, the second set of weights is different from the first set of weights and/or the second dilation rate is different from the first dilation rate.

Furthermore, in an embodiment, the first dilation kernel may characterize a first part (e.g., a projection system) of the patterning process, and a second kernel may characterize a second part (e.g., a parameter related to a feature of the substrate) of the patterning process.

During the training process, the weights of the one or more dilated kernels may be iteratively modified and/or assigned. The iteratively assigning of the weights may be performed to improve predictions of one or more features of the output tensor 1010. Such assignments of weights are done during the training procedure, such as, using back-propagation based on a local derivative of a loss function (discussed later in the disclosure). In an embodiment, the iteratively assigning weights may include assigning/adjusting a set of weights of the dilated kernel to account for, for example, aberrations of a projection system, of an apparatus of the patterning process. In an embodiment, the iteratively assigning weights may include assigning/adjusting a set of weights of the dilated kernel to characterize an aspect of the patterning process.

In an embodiment, the process P12 may output the output tensor 1010 which may be represented in the form of one or more output tensors 1010 based on the convolution operation with one or more dilated kernels. In an embodiment, the output tensor 1010 may be an output of the last layer of the deep learning model 1006, where depth of the dilated kernel is chosen such the output tensor has a depth equal to the total number of classes of the set of classes 1004. In other words, the output tensor will have an element corresponding to each pixel of the input image, where each element of the output tensor also has a depth (i.e., total number of classes). For example, if there are 10 classes, then each element of the output tensor will have 10 classes associated with it. Furthermore, each class may be assigned a probability distribution indicating a probability that a pixel belongs to that particular class.

The predicted image 1010 or the output tensor 1010 includes elements (i.e., pixels) corresponding to the pixels of the input image, each element of the output tensor 1010 having values associated with the set of classes 1004 (i.e. one or more feature of the substrate) which can be assigned unique label (i.e., a class such as a contact hole, a line, a bar, etc.), in process P14. In an embodiment, assigning a class of the set of classes 1004 to an element of the output tensor may be based on a comparison of the output tensor with the ground truth image 1001 or truth tensor. In an embodiment, the elements of the output tensor 1010 includes a set of probabilities (or probability distribution per class per pixel) associated with each class of the set of classes 1004. The probability value indicating a probability that a particular element of the output tensor belongs to a particular class. Based on the probability, a label may be assigned to each pixel, where the label corresponding to the class having maximum probability value for that element. For example, a first element associated with 10 classes (e.g., a line class, a bar class, a contact hole class, etc.) may have probability values as follows, represented by vector, [0.1 0.2 0.3 0.4 0.5 0.6 0.7 0.8 0.5 0.95]. In an embodiment, the vector may have normalized probability values such that it sums up to 1 to make it a distribution. These values shown here could be the logits values of the final layer, then softmax would result in a probability distribution. For example with 3 classes, logits=[9, 12, 10] probs=[0.04, 0.84, 0.11]=softmax(logits), then the first element can be assigned a label associated with the $10^{th}$ class (e.g., a contact hole).

Typically, in a first pass, the prediction of the labels may not be accurate, as such, the output tensor 1010 may not be accurately segmented. To generate accurate segmented image that reproduces the features of the corresponding input image 1000, several iterations (e.g., more than 1000 iterations, 50,000 iteration, 100,000 iteration, 1 million iterations, etc. depending on how quickly the performance of the model converges) may to be performed based on following processes.

In process P16, a determination may be made whether the segmented image matches or accurately reproduces the input image 1000. In response to the determination that the segmented image is accurately reproduced, the training process may end and a trained deep learning model 1050 may be obtained. The trained deep learning model 1050 may have a plurality of layers with nodes having a plurality of weights assigned as discussed above to obtain the segmented image.

However, if the segmented image does not reproduce the input image 1000 and/or the training is not converged, then in process P18, the training process may further involve training a deep learning model by iteratively assigning weights to the at least one dilated kernel based on a back propagation through the deep learning model using a loss function until the output tensor 1010 reproduces the plurality of features of the input image 1000. In an embodiment, the loss function is a function of the truth image 1001 and the probabilities of the output tensor 1010. For example, the loss function may be based on the probability of the classes assigned to output tensor 1010. The loss function may be based on a cross-entropy, a mean squared error, or other appropriate error functions. In an example, the following cross-entropy function (eq. 2) may be used as a loss function.

$$L = \sum_{i \in I}\sum_{c \in C} y_c(i) \cdot \ln p_c(i) + (1 - y_c(i))\ln(1 - p_c(i)) \quad (2)$$

In the above equation, L represents the loss function, i is the $i^{th}$ pixel in a pixelated image I, c is a class of the set of classes C, $y_c(i)$ is tensor of $i^{th}$ pixel of the truth image 1001 where an element of the tensor is one-hot coded indicating that the pixel belongs to a particular class c, $p_c(i)$ is the probability of each class that the pixel $i^{th}$ may belong to within the predicted image or output tensor.

In an example, the classes C may be represented as a feature vector such as [line, bar, contact hole, grating, oxide]. A pixel in a truth image Y may belong to one of the classes C. For example, if $i^{th}$ pixel $y_c(i)$ belongs to the contact hole class, then an element of the truth image tensor corresponding to the pixel may be one-hot coded to contact hole i.e., $y_c(i)$=[0, 0, 1, 0, 0]. Further, using the probabilities of the predicted image, the loss function may be determined using the equation (2) above. As the training process continues a value of loss function is progressively reduced, preferably minimized. In an embodiment, the truth could be probabilistic as well.

The back propagation through the deep learning model may involve inverse mapping of the output tensor of a layer (e.g., $25^{th}$ layer) to an input tensor of that particular layer or multiple prior layers. For example, the output tensor of a layer (e.g., $25^{th}$ layer) may be inverse mapped through multiple layers to an input tensor of, e.g., $5^{th}$ layer. In another example, the back propagation may involve inverse mapping of output tensor of a $25^{th}$ layer with the input tensor of the $25^{th}$ layer (i.e., the output of the $24^{th}$ layer), the output of the $24^{th}$ layer to the input tensor of the 24th layer (i.e., the output layer of the $23^{rd}$ layer), and so on. At each step (i.e., at an output of a particular layer) during the back propagation, a local derivative of the loss function may be computed. The local derivative of the loss function may be further plotted as a map (e.g., see FIG. 15) to graphically determine a direction in which to change the weights of a layer. For example, for illustrative purposes, up to 2 dimensions can be plotted. Gradient descent changes the weights such that the loss decreases. In an embodiment, one of different optimization methods, such as gradient decent, may be used to determine optimum weights so that the output tensor 1010 accurately depicts the input image 1000.

Figure 15:
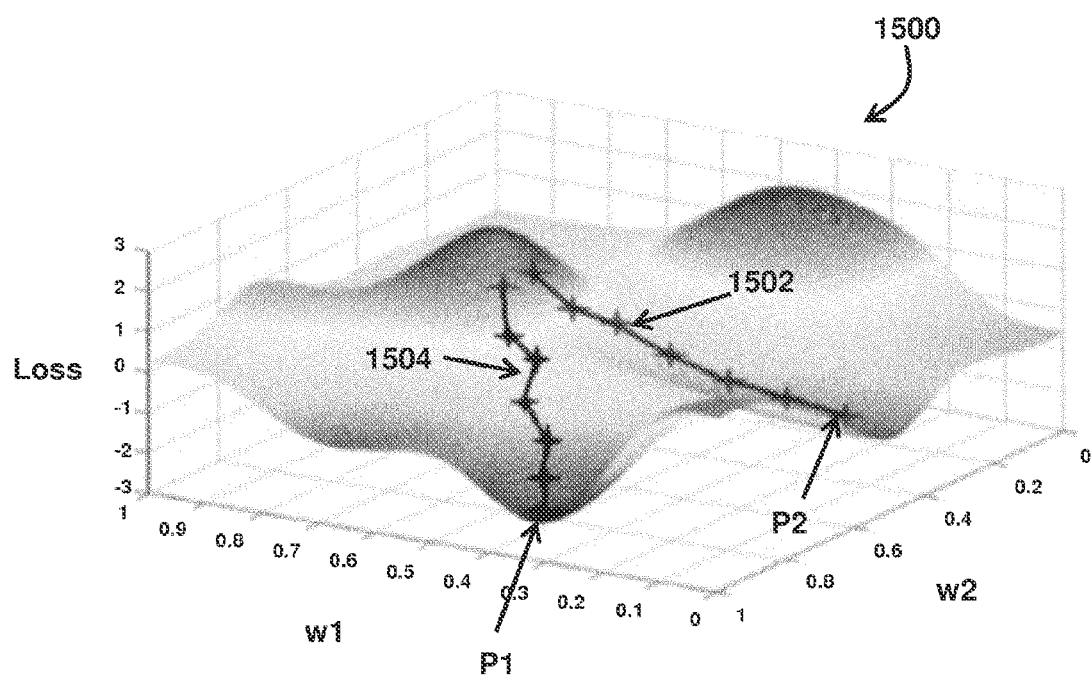
FIG. 15 is an example plot of a local derivative of a loss function, according to an embodiment.
Figure 16A:
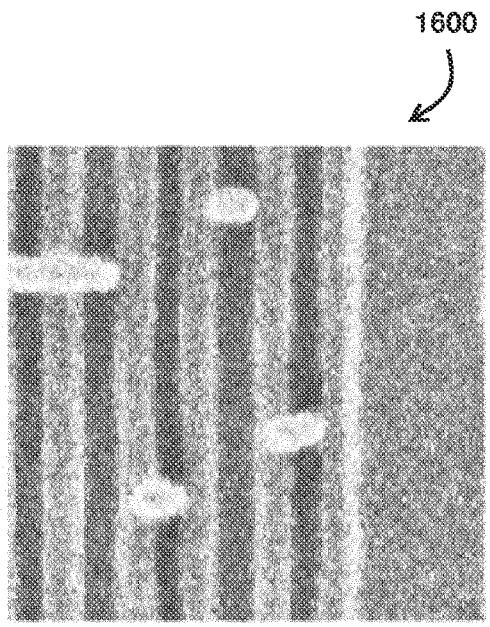
FIG. 16A illustrates an example input image of the deep learning model, according to an embodiment.
Figure 16B:
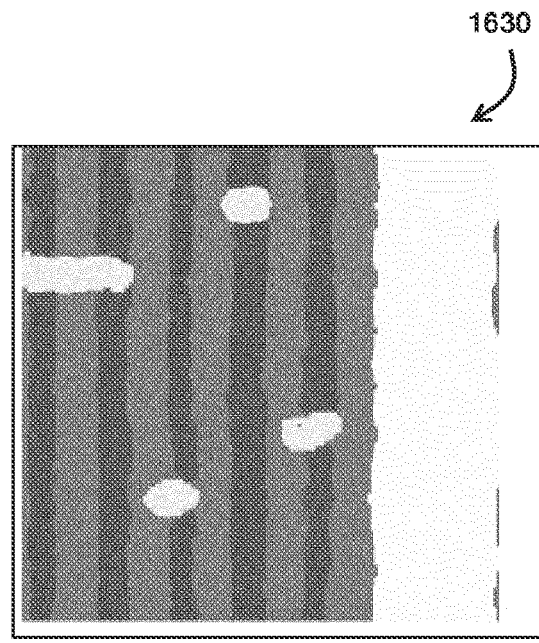
FIG. 16B illustrates an example predicted image of the input image of FIG. 16A, according to an embodiment.
Figure 16C:
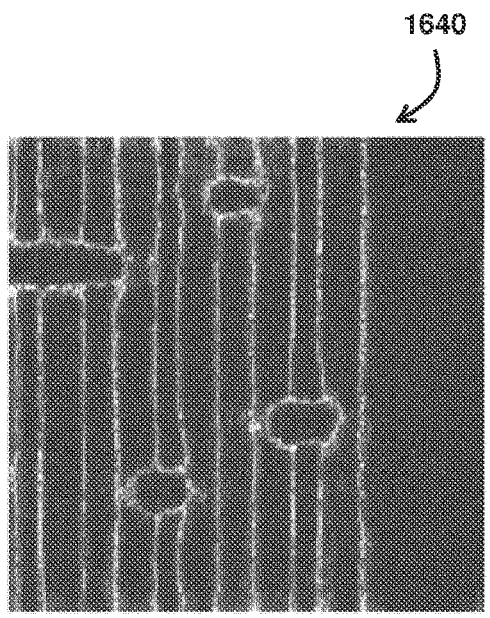
FIG. 16C illustrates an example uncertainty map of the predicted image of FIG. 16B, according to an embodiment.
Figure 16D:
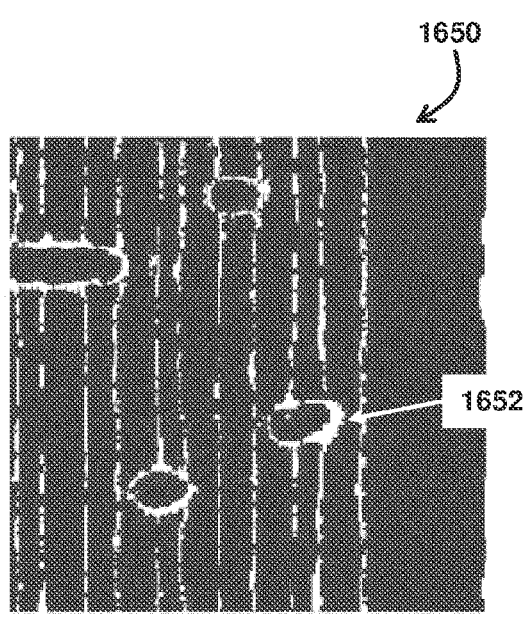
FIG. 16D illustrates an example error map of the predicted image of FIG. 16B, according to an embodiment.

FIG. 15 illustrates a map of the local derivatives at a particular layer, where the local derivative is taken with respect to the weights w1 and w2 of the dilation kernel. Then, a weight may be updated based on an optimization method, for example, gradient decent method that results in more optimal weight for that particular layer that minimizes the loss given that particular layer.

In an embodiment, the loss function may be defined such that error in identifying a particular feature is reduced, preferably minimized. For example, the loss function may be weigh particular features in the image (e.g. contact holes) more than others resulting in more emphasis to improve the segmentation on that part. Note that different image features are represented by different classes and as such different class weights allow for feature dependent contributions to the loss function.

Upon modifying the weights of one or more layers, the training method may continue from the process P12 as discussed earlier, with a different training example, where the output tensor 1010 is re-determined i.e., a different output tensor 1010 may be generated based on the modified weight. Then, the process P14 as discussed earlier, may be performed to reassign classes and generate the segmented image 1020. Further, a determination may be made as in process P16 discussed earlier, which may be followed by process P18. After several iterations, the training process may converge i.e., the loss does not significantly decrease on a validation set of images, at which point the training may be stopped and the deep learning model may be considered as the trained deep learning model 1050.

Figure 11:
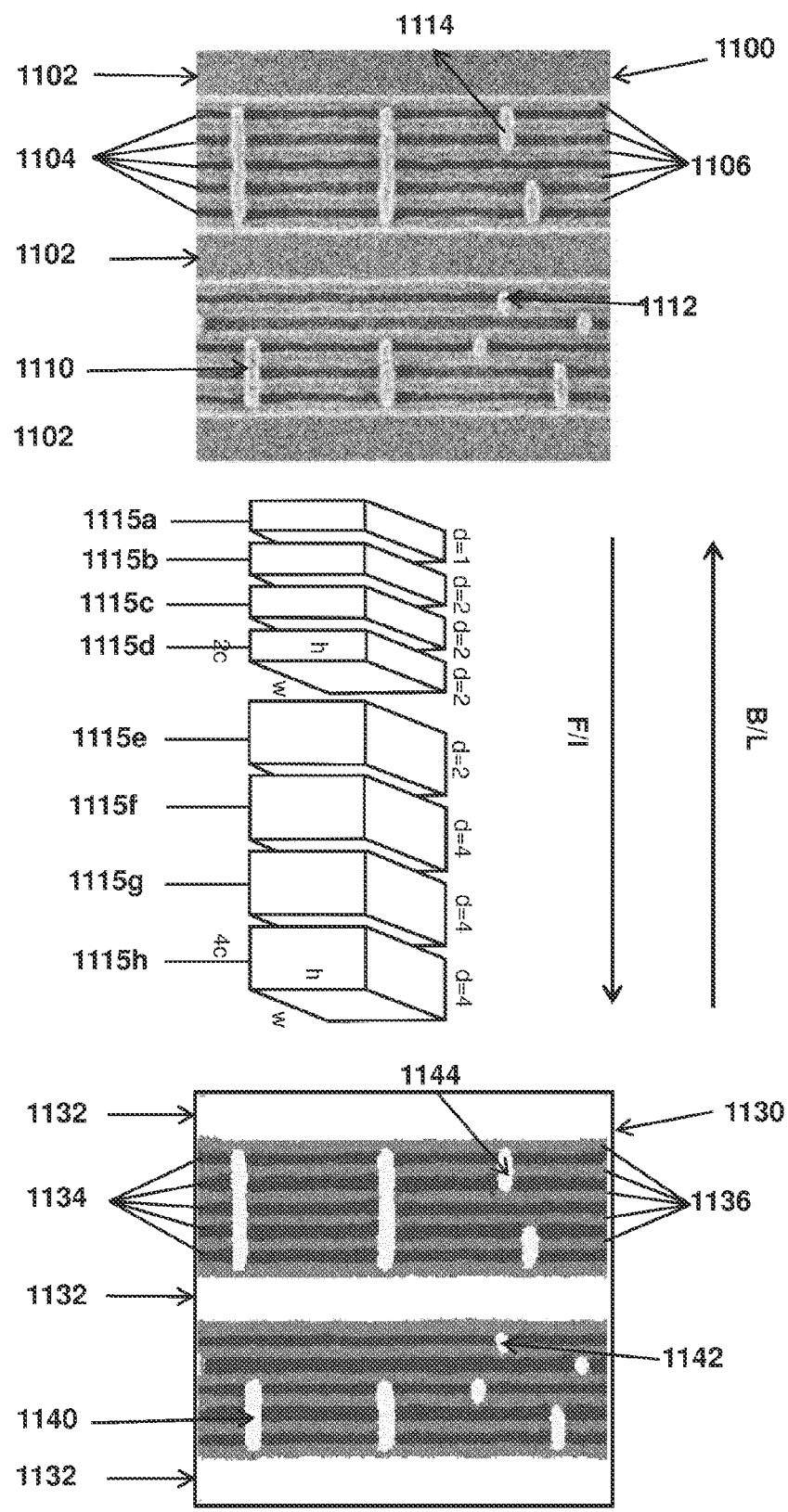
FIG. 11 illustrates an example of training the deep learning model of FIG. 10, according to an embodiment.

FIG. 11 illustrates an example of training a deep learning model such as a convolution neural network using a training data set including an input image 1100 and an output image (i.e., a segmented image) 1130. In the example of FIG. 11, the training method as discussed in FIG. 10 may be applied to generate the trained deep learning model that can accurately identify each feature of the input image 1100. The training may involve determining weights of dilation kernels of each of the layer of the neural network such that the features of the input image 1100 can be identified.

The input image 1100 is a SEM image of a part of substrate having feature such as gratings 1104 (laid horizontally), oxide layers 1106 (laid horizontally between the gratings), a power rails 1102, a first set of vertical lines such as 1110 (longest lines in the pattern), a second set of vertical lines such as 1114 (relatively smaller than 1110, but larger than smallest lines), etc. In an embodiment, the first set of lines may be characterized in terms of different geometric measurements such as size and orientation, for example, the longitudinal length, thickness or width, number of gratings crossed, relative location with respect to neighboring other features, or other appropriate geometric properties of a feature.

The deep learning model 1006 having a plurality of layers receives the input image 1100 and the segmented image 1130 (which is an example of the training data 1002). During the training process, a forward pass and backward pass (or propagation) may be performed as discussed earlier to match the input image 1100 and the segmented image 1130 such that the trained deep learning model may predict a segmented image from any input image, preferably having similar feature or subset of feature used during the training process.

In the forward pass (e.g., as discussed in process P12), the deep learning model may produce a plurality of predicted images represented as output tensors (collectively referred as output tensors 1115). For example, a first layer may produce a first output tensor 1115a based on a first dilation kernel having a dilation rate of 1 and depth of 2c, and a second output tensor 1115b based on a second dilation kernel having a dilation rate of 2 and depth of 2c. Similarly, a third output tensor 1115c and a fourth output tensor 1115d using dilation kernels based on a third and fourth dilation kernels, respectively, having a dilation rate of 2 and depth of 2c. In an embodiment, the output tensors 1115b-1115d may be produced by different layers. Similarly, a plurality of output tensors 1115e, 1115f, 1115g, and 1115h may be output by a second layer or several other layers of the deep learning model.

In the backward propagation, the aforementioned dilated kernels may be modified based on the loss function, for example as discussed earlier in the processes P12 and P18. In an embodiment, each of the dilated kernels may be assigned different weights based on the features to be identified. For example, the first kernel may be characterized to identify the feature 1102, a second kernel may be characterized to identify the feature 1104, and so no.

Eventually, after several iterations of the forward and backward propagation, an output tensor may be generated having a particular class assigned to each element of the output tensor to eventually produce the segmented image having labels such as a first labels 1132 corresponding to the class power rail (i.e., 1102 of the input image), a second label 1134 corresponding to gratings (i.e., 1104 of the input image), a third label 1136 corresponding to oxide (i.e., 1106 of the input image), a fourth label 1140 corresponding to the line (i.e., 1110 of the input image), a fifth label 1142 corresponding to the line (i.e., 1112 of the input image), and a sixth label 1144 corresponding to the line (i.e., 1114 of the input image), and so on.

In an example, refer FIG. 16A-16D, the trained deep learning model may receive an input image 1600 and produce a segmented image 1630 corresponding to the input image 1600. Although, segmented image 1630 illustrated unique labels, each pixel of the segmented image 1630 also includes additional information including the probability distribution of a particular class. Hence, based on the probability distribution, several probability related measures may be determined such as an uncertainty and/or error in identifying the particular label. For example, using the probability distribution of each pixel an uncertainty map 1640 may be generated. In another example, an error map 1650 may be generated using the probabilities. Based on the amount of uncertainty in the map 1640, sub-pixel accuracies may be derived, for example, via interpolation.

In an embodiment, the segmented image may be further used to determine parameters (e.g., CD, EPE, LER, necking, overlay, etc.) related to the features generated during the patterning process. Based on the parameters, defects (e.g., EPE) in the patterning process may be determined.

Figure 17A:
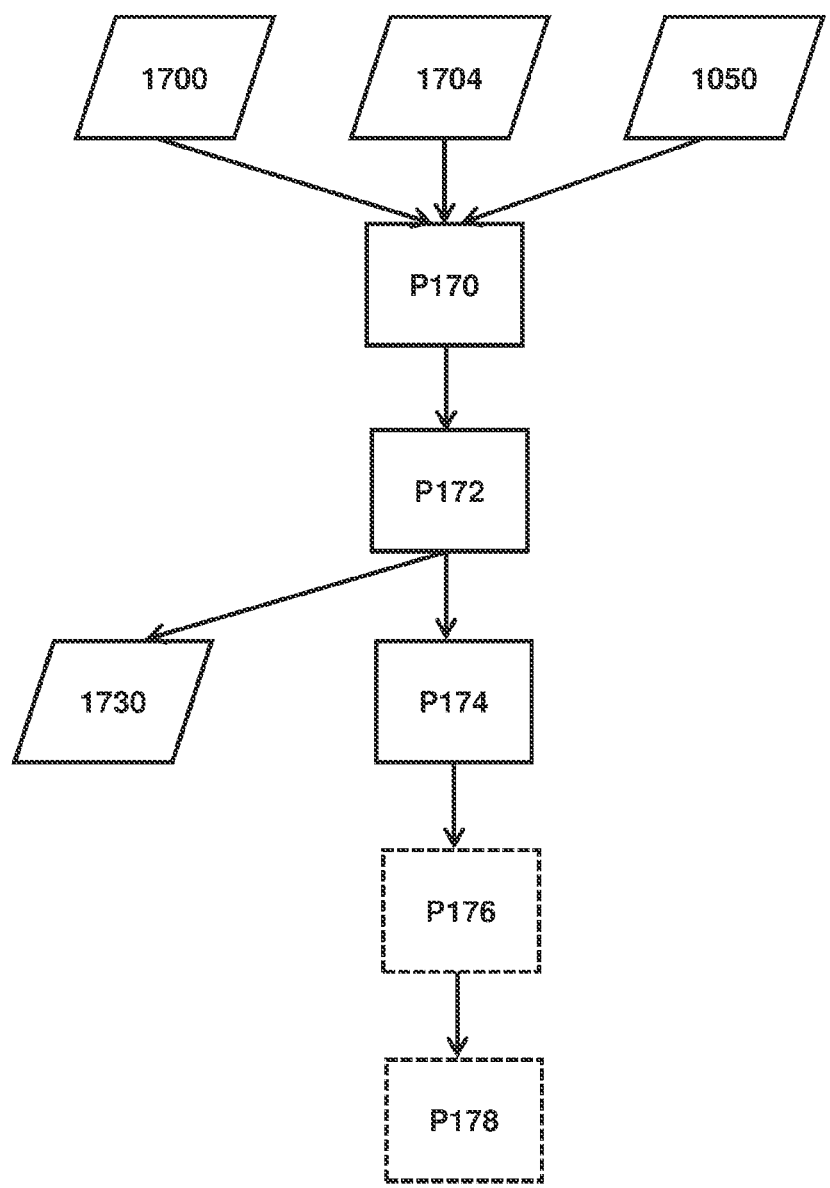
FIG. 17A schematically shows a flow for a method of semantic segmentation based on a trained deep learning model, according to an embodiment.

FIG. 17A illustrates a method of applying the trained deep learning model for determining a parameter of a feature of the patterning process. An input image of at least a part of a substrate may be passed through the trained deep learning model to generate a segmented image. The segmented image clearly depict the features of the substrate which may be measured to determine parameters (e.g., CD) of the substrate. In an embodiment, the parameters may be used to determine an adjustment to the patterning process. The patterning process based on segmented images may produce more accurate results compared to the contouring based methods.

For example, the segmented image generated from the trained deep learning model may identify or differentiate between the features, charging effect such as flare around a feature (see FIG. 18A), features having similar materials, etc. compared to non-segmented or grey-scale image (e.g., SEM image). On the other hand, using a SEM image such as the input image 1100 without segmentation to determine the parameters related to the features may produce inaccurate results. For example, in the input image 1100, it may be unclear where a particular feature ends and another begins, for example, when the overlapping features are made of similar materials. In such as case, based on SEM images, features such as feature 1114 and oxide layer 1106 may not be distinguishable. The feature 1114 extends above the grating 1104 and at a tip (on a top end) of the feature 1114 overlaps with the oxide layer 1106 which is made of similar oxide-type material. Taking measurements based on such images will clearly result in inaccurate measurements, consequently defects may be introduced during the patterning process. As such, semantic segmentation according to the present method may improve identification of various feature more accurately compared to that based on grey-scale images. In general, the term semantic segmentation refers to a process of assigning labels or class to each feature of any image and the resulting image of the process is referred as segmented image.

In process P170, the trained deep learning model 1050 (e.g., as discussed in FIG. 10) with the set of classes 1704 (an example or a subset of set of classes 1004) used to train the model 1050 may be obtained. Each class correspond to a feature of a training substrate (e.g., input image 1100 and the segmented image 1130) used for training the trained deep learning model. In addition, an input image 1700 (e.g., a SEM image) of at least part of a substrate undergoing the patterning process having a plurality of features may be obtained. The input image 1700 is an image that may be segmented using the trained deep learning model 1050. The input image 1700 may be any image different from that obtaining the trained model 1050.

Figure 17B:
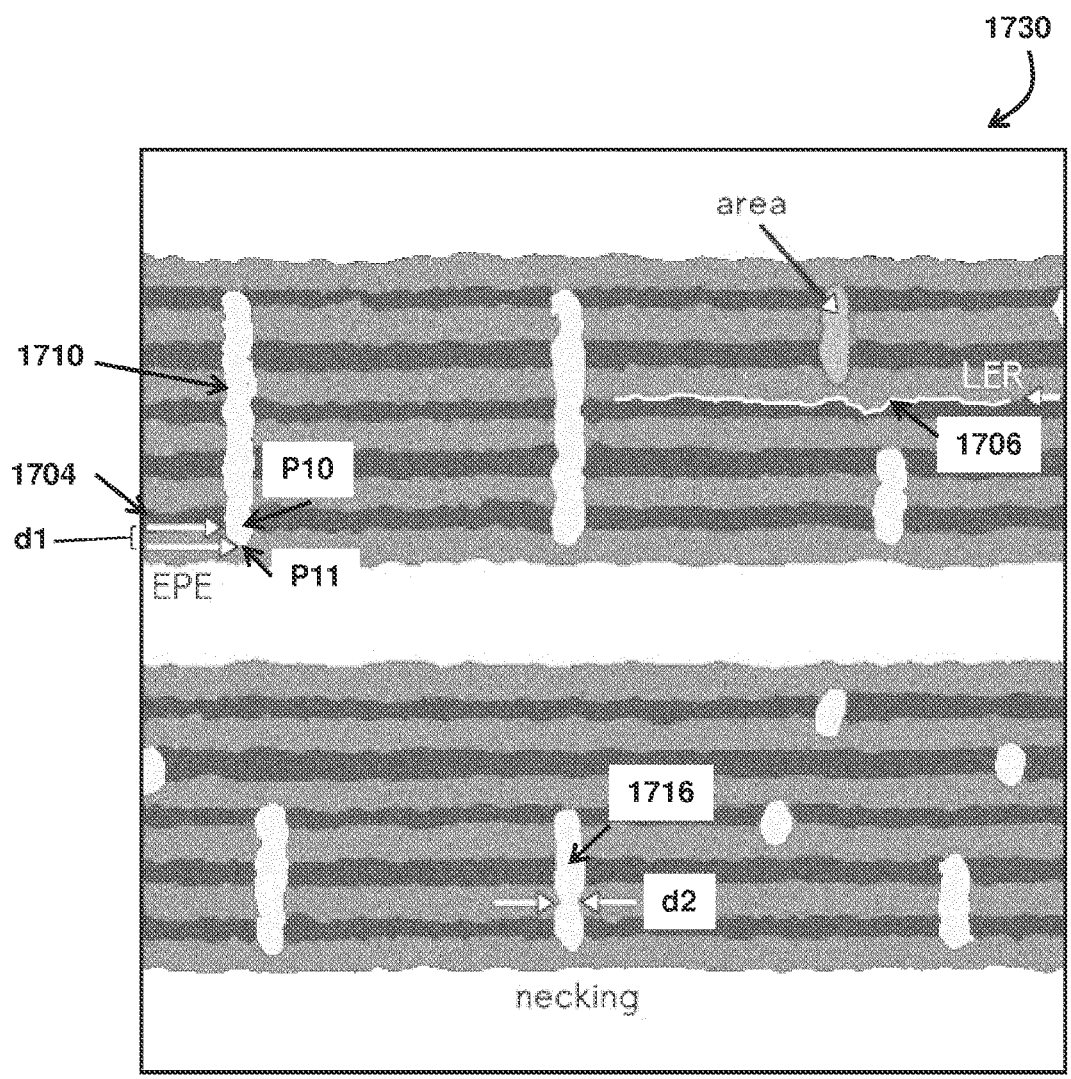
FIG. 17B is an example segmented image from the trained deep learning model of FIG. 17A, according to an embodiment.

In process P172, the method may involve generating a segmented image 1730 by modeling and/or simulation of the trained deep learning model 1050 using the input image 1700 and the set of classes 1704, wherein the plurality of features of the input image are reproduced in the segmented image 1700. In process P172, the trained model 1050 may not be modified and the segmented image 1730 may be generated in a single pass, since the weights of the dilated kernels are already assigned in the trained model 1050. Executing such trained model P172 may produce accurate results. Furthermore, uncertainty and error data (e.g., error data available when the training data includes a ground truth) may be derived using the probabilities associated with the labels (i.e., the set of classes) that may be further used to determine a confidence in measurements of a feature in the segmented image 1730. An example segmented image 1730 is illustrated in FIG. 17B.

In an embodiment, generating the segmented image 1730 may include assigning a label (i.e., a class of the set of classes 1704) to each pixel of the segmented image 1730. Each pixel of the segmented image 1730 is associated with information including the set of classes, a set of probabilities corresponding to each class of the set of classes, and a location on the segmented image. The label may correspond to a feature of the set of features having, for example, maximum probability of the probabilities associated with set of classes. In an embodiment, the segmented image 1730 may include features such as line 1710, 1714, 1716, etc., as illustrated in FIG. 17B. In an embodiment, the label may represent each feature and each label may be color coded to clearly distinguish one feature from another.

In process P174, based on the segmented image 1730, a parameter of the patterning process may be determined. The determination of a parameter of the patterning process may include performing measurements on the plurality of features within the segmented image 1730. The measurements may include measurement of a feature dimension, a distance between one or more features of the plurality of features, or other geometric measurements that may be performed. The measurements may be automatically performed based on the location of each pixel. For example, a process may be programmed to identify a first pixel of a feature and a last pixel of the same feature along a horizontal line and the distance between the pixels may be derived based on the location information associated with each pixel. Furthermore, an uncertainty in measurement of the distance may be computed based on the probabilities associated with the respective pixels. Thus, providing a measure of confidence in a particular measurement.

Furthermore, more complex measurements may be determined such as a curvature at an end of the feature (e.g., at point P11 of feature 1710), a variation in dimensions along a length of the features, an area of an irregular feature (e.g., a dust particle), etc. which can be further supplemented with an uncertainty and/or error in measurements based on the probabilities associated with the respective pixels.

Further, based on the measurements, values of parameters may be determined for the plurality of features. The parameter may be an edge placement error, overlay, a line edge roughness, necking, and/or CD related to the plurality of features of the segmented image 1730. In an example, the parameter may be EPE between different features, a minimum/maximum CD value along a length (or width) of a feature, a line edge roughness (LER) along a length of a feature, a total area of the feature, or other appropriate parameters that may be derived to determine a quality or defects in a substrate of the patterning process.

In an example, as shown in FIG. 17B, EPE of a feature 1710 may be determined. In an embodiment, EPE may be an offset or a distance between edge of a feature with respect to another feature. For example, the EPE of the feature 1710 may be defined as a distance d1 measured from an edge of the grating (e.g., at P10) to the end of the feature 1710. If the distance d1 is less than a predetermined threshold, then there is EPE between the feature 1710 and grating 1704. Such predetermined thresholds may be based on experience, or past patterning data that may be stored in a database. The distance d1 may indicate how much the feature 1710 should extend to prevent a defect such as shorting. For example, the feature 1710 may be designed to block a certain portion of the grating within which electrically conducting material may be deposited during the patterning process. If the distance d1 is less than a predetermined threshold, or the edge at P1 does not completely block an area (e.g., leaves an open area) in the grating, then the electrically conducting material on a left side and a right side of the feature 1710 may be bridged creating an electrically shorting path. Such shorting is undesired and may render the chip produced from such substrate defective, which may need to be discarded. Accordingly, monitoring such EPE may be desired to discard the substrate early in the patterning process to save time and processing cost, effectively increasing a yield of the patterning process. In an embodiment, adjustments (e.g., to process variables such as dose or focus) may be performed to the patterning process based on the parameters related to the features to prevent recurrence of similar defects on other substrates, as patterning process is a highly repetitive process where similar operations (e.g., pattern transfer, etching and deposition) are repeatedly performed on the same substrate or a different substrate.

Similarly, in another example, measurements may be performed on the feature 1716, for example, a width of the line along the length. In case, the width is less than a particular threshold, then a necking may be detected. For example, a necking may be detected at a location of the feature 1716, since the width d2 (e.g., 10 nm) may be less than 50% of a selected width (e.g., 20 nm) of the feature 1716.

In an embodiment, in process P176, based on the parameter of the patterning process, an adjustment to the patterning process may be determined. The adjustment may be to the process variable (e.g., a dose, a focus, a scanner level, etc.) of the patterning process to prevent an error or defect from occurring in subsequent processing of the same substrate or different substrate. The adjustment may be determined using simulation and/or modeling of the patterning process such as process models discussed earlier in the disclosure. Furthermore, in process P178, the adjustment may be applied to adjust the patterning process. In other words, patterning on a substrate may be performed with adjustment applied to one or more apparatus of the patterning process.

The semantic segmentation process may be advantageous for determining features suffering from charging effects, often observed in HMI or SEM images. A charging effect is visible as a flare around a feature. Such charging effect hampers analysis of the features on a substrate and efforts are made to model such charging effect to account for such effect. The semantic segmentation may be used to analyze such images.

Figures 18A, 18B:
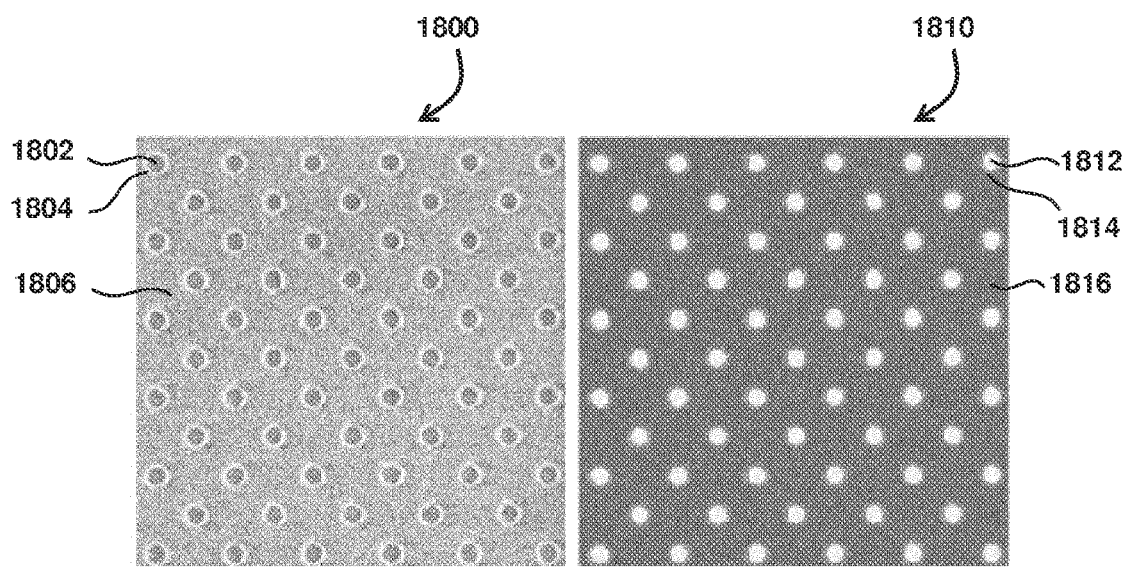
FIG. 18A is an example input image having charging effect, according to an embodiment.
FIG. 18B is an example segmented image of the input image of FIG. 18A, according to an embodiment.

FIG. 18A illustrates an image including the charging effect (i.e., a flare) around the feature (i.e., contact holes). The input image 1800 includes three features (or classes): a contact hole 1802, a flare 1804, and background 1806. The contact hole 1802 is surrounded by a flare 1804 (depicted as a white ring around the dark region i.e., a contact hole). A deep leaning model may be trained to perform semantic segmentation of such flare (e.g., 1814), contact holes 1812 and the background 1816. In an embodiment, the deep learning model may be trained to generate a segmented image 1810, where the flare 1814 may be lumped together with a background 1816 (which corresponds to a background 1806) and interpreted as noise rather than part of the contact hole 1812. Accordingly, the trained deep learning model may include weights such that the flare is interpreted as a background, hence, the contact hole may be segmented distinctly. In an embodiment, flare may be assigned a label to further explore geometric or optical properties of the flare with respect to the feature sizes, location, etc.

Figure 19A:
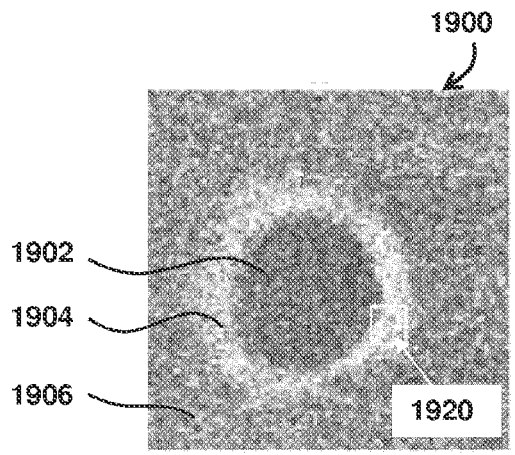
FIG. 19A is a crop of the input image of FIG. 18A, according to an embodiment.
Figure 19B:
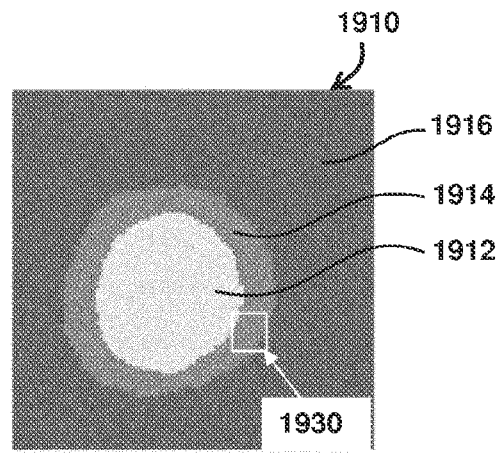
FIG. 19B is a crop of the segmented image of FIG. 18B, according to an embodiment.
Figure 19C:
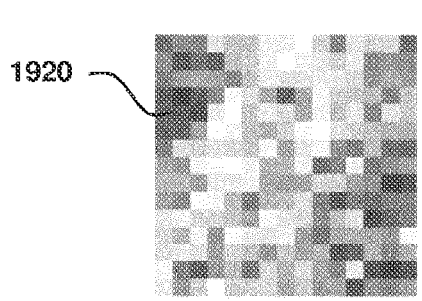
FIG. 19C is a zoomed portion of the crop of FIG. 19A, according to an embodiment.
Figure 19D:
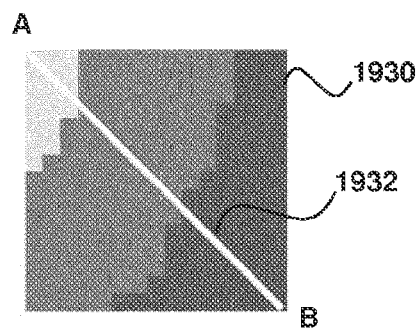
FIG. 19D is a zoomed portion of the crop of FIG. 19B, according to an embodiment.
Figure 19E:
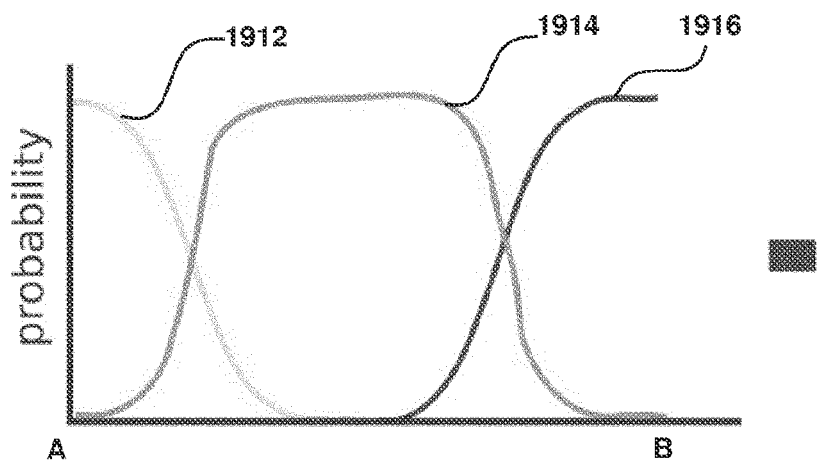
FIG. 19E illustrates an example probability distribution of features within the zoomed portion of the FIG. 19D, according to an embodiment.

FIGS. 19A-19E, further illustrate the advantages of the semantic segmentation method with respect to charging effect. A cropped image 1900 is a crop of a part of the input image 1800 discussed earlier. The cropped image 1900 illustrates the feature 1902 (i.e., contact hole), a flare 1904 surrounding the contact hole, and a background 1906. After segmentation, a segmented image 1910 (in FIG. 19B) may be obtained where a first label (or class/feature) 1912 corresponds to 1902, a second label (or class/feature) 1914 corresponds to the flare 1902, and a third label 1916 (or class/feature) corresponds to the background 1906. Further, a portion of the cropped image 1900 is zoomed in FIG. 19C and a corresponding portion of the segmented image 1910 is equally zoomed in FIG. 19D. The cropped image 1920 does not clearly distinguish between the three features 1902, 1904, and 1906. On the other hand, the segmented image 1930 more clearly distinguish such features. Furthermore, each pixel within the segmented image 1930 is associated with the probability that a particular pixel belongs to a particular class. For example, a probability distribution of the pixels along a line 1932 from A to B is illustrated in FIG. 19E. In FIG. 19E, at point A, the probability that the pixel belongs to the first label 1912 is highest compared to the other labels 1914 and 1916. As pixels are further from the point A moving towards the point B, the probability that a particular pixel should be assigned the first label 1912 decreases. Similarly, as of the first label is less than the second label 1914, the segmented image 1932 shows the second label 1914 instead of the first label 1912. Further, as the pixels are closer to the point B, the probability of the third label 1916 is relatively higher than other labels. Thus, the features on the substrate subject charging effect are not only better distinguished but can be measured with measurements having certain range of accuracy or confidence values.

In an embodiment, one or more deep learning models maybe developed depending on the features or pattern layout of the substrate. For example, a first deep learning model may be trained to perform semantic segmentation of features such a line, bar, grating, etc. as shown in the input image 1100 (in FIG. 11). The training of the first deep learning model is discussed earlier in the disclosure.

Figure 20A:
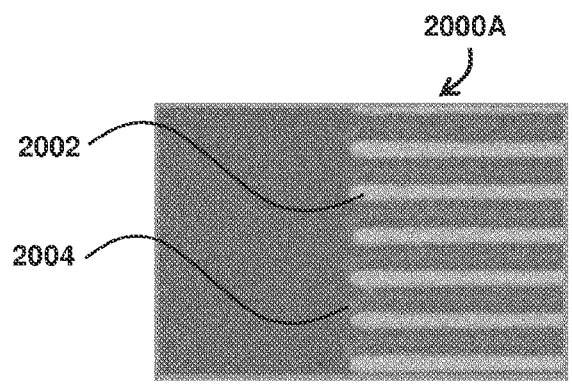
FIGS. 20A and 20B are an example input image and segmented image, respectively used to train a second deep learning model, according to an embodiment.
Figure 20B:
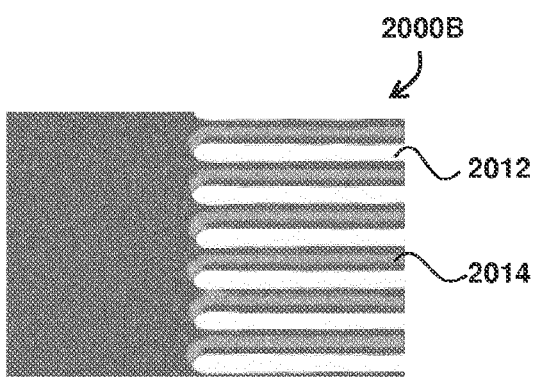

In another example, a second deep leaning model may be trained to perform semantic segmentation of features such as shown in FIGS. 20A and 20B. FIG. 20A illustrates an input image 2000A having features 2002 and 2004. A segmented image 2000B, in FIG. 20B, illustrates the features 2012 and 2014 corresponding to the features 2002 and 2004. In an embodiment, the features 2002 and 2004 may be different from the features in image 1100, as such, the first trained model may not be label or identify the features accurately. In other words the amount of error and/or uncertainty in a label to unknown features may be relatively high compared to that of known features (i.e., features for this the first model may be trained with).

Figure 21A:
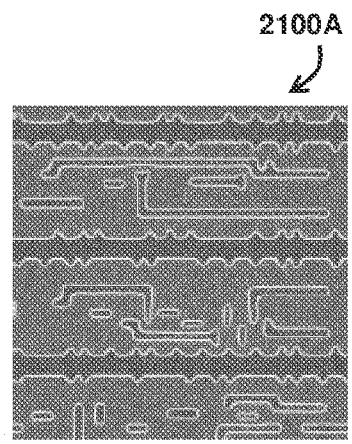
FIGS. 21A and 21B are an example input image and segmented image, respectively used to train a third deep learning model, according to an embodiment.
Figure 21B:
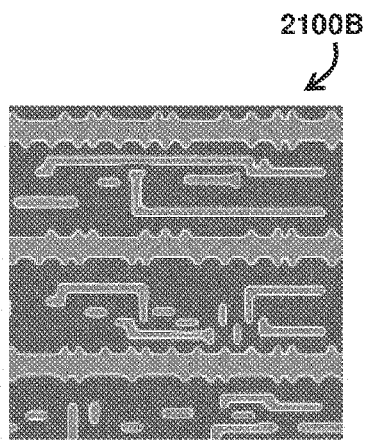

Similarly, in another example, a third semantic model may be trained to identify a pattern or features such as in FIGS. 21A and 21B. FIG. 21A illustrates an input image 2100A and FIG. 21B illustrate a segmented image 2100B corresponding to the input image 2100A. The input image 2100A includes several features that have substantially different shape and size compared to the features in the images 1100 and 2000A.

Accordingly, in an embodiment, different models may be trained and applied, then based on the uncertainty and error maps of each model, a particular model may be used to identify certain type of features. For example, the first trained model may exhibit lowest error in identifying features of image 1100, while the same first trained model may exhibit highest error in identifying the features of the image 2100A. In such a case, the first trained model may be selected to identify features similar to the image 1100.

The first, second, and third models are discussed only by way of example, and does not limit present disclosure. In an embodiment a single model may be trained for all the features of the 1100, 2000A, and 2100A.

The semantic segmentation based on the trained deep learning model has several advantages. The trained deep learning model may identify features that the model is trained to identify across different images without retraining or retuning of the parameters (e.g., weights, biases or constants) of the model. Furthermore, no retuning may be required to identify or trace a contour (i.e., an outline) of a feature when the trained model is applied to different images of a substrate or different substrates of the patterning process. Furthermore, dimensions of a feature on a substrate may be determined to derive parameters (e.g., CD, overlay, EPE, etc.) of the patterning process (as discussed earlier). Based on the parameters one or more defects of the substrate may be identified and the patterning process may be adjusted to improve the yield of the patterning process.

The trained deep learning model may not be retuned (or retrained) to identify similar feature types on different images; unlike in a contour determination technique. The counter determination technique typically requires retuning of parameters (i.e., functions, variables or constants) used in a contour determination algorithm depending on an image and may lead to inter-image variance. For example, a first image may include a particular feature (e.g., contact hole), then the conventional contour determination algorithm may need retuning for the same feature (e.g., contact hole) on a different image (e.g., SEM image acquired for a different part of the same substrate or different substrate). On the other hand, the semantic segmentation based on the trained deep learning model, where the model is trained for a feature type (e.g., contact hole) may not be re-trained or retuned to identify the same feature type on a different image. As no re-tuning is required, the patterning process may be improved with less computation resources and time when trained deep learning models compared to contour determination algorithms are used during the patterning process.

Figure 22:
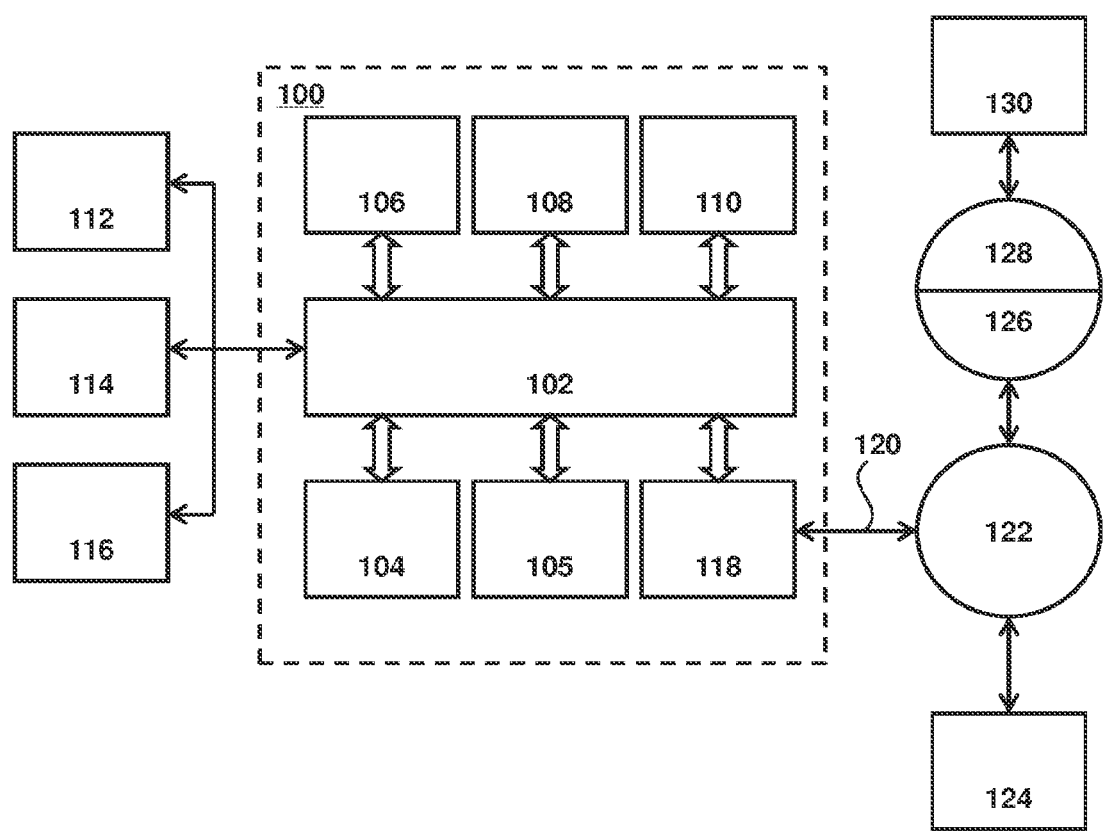
FIG. 22 is a block diagram of an example computer system.

FIG. 22 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

The embodiments may further be described using the following clauses:

1. A method for training a deep learning model of a patterning process, the method comprising:
   obtaining (i) training data comprising an input image of at least a part of a substrate having a plurality of features and a truth image corresponding to the input image, (ii) a set of classes, each class corresponding to a feature of the plurality of features of the substrate within the input image, and (iii) a deep learning model configured to receive the training data and the set of classes;
   generating a predicted image, by modeling and/or simulation of the deep learning model using the input image, wherein the deep learning model iteratively performs a convolution operation with at least one dilation kernels comprising a plurality of weights;
   assigning a class of the set of classes to a feature within the predicted image based on matching of the feature with a corresponding feature within the truth image; and
   generating, by modeling and/or simulation, a trained deep learning model by iteratively assigning weights to the at least one dilated kernel based on a back propagation through the deep learning model using a loss function such that the predicted image reproduces the plurality of features of the input image.

2. The method according to clause 1, wherein the convolution operation comprises
   overlapping the input image with the at least one dilation kernel,
   determining a product between each overlapping elements including a weight of the at least one dilation kernel and a value of a pixel of the input image, and
   summing results of the product to determine a value of the convolution operation.

3. The method of any of clauses 1-2, wherein the at least one dilation kernel comprises a plurality of weights, a dilation rate, and a depth, wherein the depth is a multiple of a number of classes of the set of classes.

4. The method of any of clauses 1-3, wherein the loss function is a function of the truth image and a probability of each class of the set of classes assigned to the predicted image.

5. The method according to clause 4, wherein the iteratively assigning weights comprises modifying the plurality of weights of the dilated kernel, the dilation rate, and/or the depth to characterize at least a part of the patterning process based on a local derivative of the loss function.

6. The method of any of clauses 1-5, wherein the at least one dilation kernel comprises
   a first dilation kernel of the at least one dilation kernel comprises a first set of weights, a first dilation rate and a depth equal to a number of classes of the set of classes;
   a second dilation kernel of the at least one dilation kernel comprises a second set of weights, a second dilation rate and a depth equal to a number of classes of the set of classes, wherein the second set of weights is different from the first set of weights and/or the second dilation rate is different from the first dilation rate.

7. The method according to clause 6, wherein the first dilation kernel characterizes a first part of the patterning process, and a second kernel characterizes a second part of the patterning process, wherein the second part is a projection system of the patterning process and the second part is a parameter related to the feature of the substrate.

8. The method of any of clauses 1-7, wherein the dilated kernel is symmetric to characterize a projection system of an apparatus of the patterning process.

9. The method according to clause 8, wherein the iteratively assigning weights comprises assigning a first set of weights to the plurality of weights of the dilated kernel to characterize a projection system of an apparatus of the patterning process.

10. The method of any of clauses 1-9, wherein the dilation rate is an integer value between 1 and 10.

11. A method of applying a trained deep learning model to a patterning process, the method comprising:
    obtaining (i) the trained deep learning model, (ii) a set of classes, each class corresponding to a feature of a training substrate used for training the trained deep learning model, and (iii) an input image of at least part of a substrate undergoing the patterning process having a plurality of features;
    generating a segmented image by modeling and/or simulation of the trained deep learning model using the input image and the set of classes, wherein the plurality of features of the input image are reproduced in the segmented image; and
    determining a parameter of the patterning process based on the plurality of features of the segmented image.

12. The method according to clause 11, wherein generating a segmented image comprises assigning a class of the set of classes to each pixel of the segmented image, wherein the label corresponds to a feature of the set of features having maximum probability, and the segmented image is pixelated.

13. The method according to clause 12, wherein each pixel of the segmented image is associated with information comprising the set of classes, a set of probabilities corresponding to each class of the set of classes, and a location on the segmented image.

14. The method of any of clauses 11-13, wherein determining a parameter of the patterning process comprises
    performing measurements on the plurality of features within the segmented image, the measurements comprises a feature dimension, and/or a distance between one or more features of the plurality of features; and
    determining the parameter based on the measurements related to the plurality of features.

15. The method of any of clauses 11-14, wherein the parameter is an edge placement error, overlay, a line edge roughness, necking, and/or CD.

16. The method of any of clauses 11-15, further comprising:
    determining an adjustment to the patterning process, based on the parameter related to a feature; and
    responsive to the adjustment, adjusting the patterning process.

17. The method according to clause 16, wherein, the adjustment includes adjustment to a process variable including dose and/or focus.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, change in order or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While specific embodiments of the disclosure have been described above, it will be appreciated that the embodiments may be practiced otherwise than as described.

What is claimed is:

1. A method for training a deep learning model of a patterning process, the method comprising:
   obtaining training data comprising an input image of at least a part of a substrate having a plurality of features and comprising a truth image corresponding to the input image, the truth image comprising at least one feature of the plurality of features and having associated with each at least one feature a class from a set of classes, each class of the set of classes corresponding to a different feature of the plurality of features of the substrate; and
   generating, by a hardware computer using the training data, a trained deep learning model by adjusting at least one dilated kernel based on a back propagation through the deep learning model using a loss function such that a predicted image reproduces the one or more features of the input image with one or more classes of the set of classes associated with the one or more features of the input image, wherein a feature within the predicted image is assigned a class of a set of classes based on matching of the feature with a corresponding feature within a truth image corresponding to the input image.

2. The method according to claim 1, wherein the generating the trained deep leaning model comprises:
   overlapping the input image with the at least one dilation kernel,
   determining a product between each overlapping element including a weight of the at least one dilation kernel and a value of a pixel of the input image, and
   summing results of the product.

3. The method of claim 1, wherein the at least one dilation kernel comprises a plurality of weights, a dilation rate, and a depth, wherein the depth is a multiple of a number of classes of the set of classes.

4. The method of claim 1, wherein the loss function is a function of the truth image and a probability of each class of the set of classes assigned to the predicted image.

5. The method of claim 1, wherein the at least one dilation kernel comprises:
   a first dilation kernel of the at least one dilation kernel, the first dilation kernel comprises a first set of weights, a first dilation rate and a depth equal to a number of classes of the set of classes;
   a second dilation kernel of the at least one dilation kernel, the second dilation kernel comprises a second set of weights, a second dilation rate and a depth equal to a number of classes of the set of classes, wherein the second set of weights is different from the first set of weights and/or the second dilation rate is different from the first dilation rate.

6. The method according to claim 5, wherein the first dilation kernel characterizes a first part of the patterning process, and the second dilation kernel characterizes a second part of the patterning process, wherein the first part is a projection system of the patterning process and the second part is a parameter related to a feature of the substrate.

7. The method of claim 1, wherein the at least one dilated kernel is symmetric to characterize a projection system of an apparatus of the patterning process.

8. A computer program product comprising a non-transitory computer readable medium having instructions therein, the instructions, when executed by a computer system, are configured to cause the computer system to at least:
   obtain training data comprising an input image of at least a part of a substrate having a plurality of features and comprising a truth image corresponding to the input image, the truth image comprising at least one feature of the plurality of features and having associated with each at least one feature a class from a set of classes, each class of the set of classes corresponding to a different feature of the plurality of features of the substrate; and
   generate, using the training data, a trained deep learning model by adjustment of at least one dilated kernel based on a back propagation through the deep learning model using a loss function such that a predicted image reproduces the one or more features of the input image with one or more classes of the set of classes associated with the one or more features of the input image, wherein a feature within the predicted image is assigned a class of a set of classes based on matching of the feature with a corresponding feature within a truth image corresponding to the input image.

9. The computer program product of claim 8, wherein the instructions configured to cause the computer system to generate the trained deep leaning model are further configured to cause the computer system to:
   overlap the input image with the at least one dilation kernel,
   determine a product between each overlapping element including a weight of the at least one dilation kernel and a value of a pixel of the input image, and
   sum results of the product.

10. The computer program product of claim 8, wherein the at least one dilation kernel comprises a plurality of weights, a dilation rate, and a depth, wherein the depth is a multiple of a number of classes of the set of classes.

11. The computer program product of claim 8, wherein the loss function is a function of the truth image and a probability of each class of the set of classes assigned to the predicted image.

12. The computer program product of claim 8, wherein the at least one dilation kernel comprises:
   a first dilation kernel of the at least one dilation kernel, the first dilation kernel comprises a first set of weights, a first dilation rate and a depth equal to a number of classes of the set of classes;
   a second dilation kernel of the at least one dilation kernel, the second dilation kernel comprises a second set of weights, a second dilation rate and a depth equal to a number of classes of the set of classes, wherein the second set of weights is different from the first set of weights and/or the second dilation rate is different from the first dilation rate.

13. A method comprising:
obtaining a trained deep learning model, the trained deep learning model trained by adjusting at least one dilated kernel based on a back propagation through the deep learning model using a loss function such that a predicted image predicted by the deep learning model from an input image reproduces one or more features of the input image with one or more classes of a set of classes associated with the one or more features of the input image, wherein, in the training, a feature within the predicted image was assigned a class of a set of classes based on matching of the feature with a corresponding feature within a truth image corresponding to the input image, the truth image comprising a plurality of features and having associated with each feature of the plurality of features a class from the set of classes, each class of the set of classes corresponding to a different feature of the plurality of features;
applying a sample image to the trained deep learning model;
generating, by the trained deep learning model based on the sample image, one or more classes corresponding to one or more features within the sample image.

14. The method of claim 13, wherein each class of the set of classes corresponds to a different functional component or structure of a semiconductor device.

15. The method of claim 13, further comprising determining a parameter of a patterning process based on the one or more classes.

16. The method of claim 15, wherein the parameter is an edge placement error, overlay, a line edge roughness, necking, and/or CD.

17. A computer program product comprising a non-transitory computer readable medium having instructions therein, the instructions, when executed by a computer system, are configured to cause the computer system to at least:
obtain a trained deep learning model, the trained deep learning model trained by adjusting at least one dilated kernel based on a back propagation through the deep learning model using a loss function such that a predicted image predicted by the deep learning model from an input image reproduces one or more features of the input image with one or more classes of a set of classes associated with the one or more features of the input image, wherein, in the training, a feature within the predicted image was assigned a class of a set of classes based on matching of the feature with a corresponding feature within a truth image corresponding to the input image, the truth image comprising a plurality of features and having associated with each feature of the plurality of features a class from the set of classes, each class of the set of classes corresponding to a different feature of the plurality of features;
apply a sample image to the trained deep learning model;
generate, by the trained deep learning model based on the sample image, one or more classes corresponding to one or more features within the sample image.

18. The computer program product of claim 17, wherein each class of the set of classes corresponds to a different functional component or structure of a semiconductor device.

19. The computer program product of claim 17, wherein the instructions are further configured to cause computer system to determine a parameter of a patterning process based on the one or more classes.

20. The computer program product of claim 19, wherein the parameter is an edge placement error, overlay, a line edge roughness, necking, and/or CD.

* * * * *